(12) United States Patent
Kim et al.

(10) Patent No.: US 12,342,662 B2
(45) Date of Patent: Jun. 24, 2025

(54) ULTRAVIOLET EMITTING OPTICAL DEVICE AND OPERATING METHOD THEREOF

(71) Applicant: UNIVERSITY-INDUSTRY COOPERATION GROUP OF KYUNG HEE UNIVERSITY, Gyeonggi-do (KR)

(72) Inventors: Youngduck Kim, Seongnam-si (KR); Seungmin Park, Suwon-si (KR)

(73) Assignee: University-Industry Cooperation Group of Kyung Hee University, Gyeonggi-do (KR)

( * ) Notice: Subject to any disclaimer, the term of this patent is extended or adjusted under 35 U.S.C. 154(b) by 783 days.

(21) Appl. No.: 17/517,035

(22) Filed: Nov. 2, 2021

(65) Prior Publication Data
US 2022/0416121 A1 Dec. 29, 2022

(30) Foreign Application Priority Data
Jun. 28, 2021 (KR) ........................ 10-2021-0083673

(51) Int. Cl.
*H10H 20/818* (2025.01)
*H10H 20/825* (2025.01)
*H10H 20/831* (2025.01)

(52) U.S. Cl.
CPC ........ *H10H 20/818* (2025.01); *H10H 20/825* (2025.01); *H10H 20/831* (2025.01)

(58) Field of Classification Search
CPC ......... H01L 33/18; H01L 33/32; H01L 33/38; H01L 33/025; H01L 33/26; H01L 33/40; H01L 33/52; C09K 11/63; H05B 33/14
See application file for complete search history.

(56) References Cited

U.S. PATENT DOCUMENTS

| | | | | |
|---|---|---|---|---|
| 9,450,157 B2* | 9/2016 | Yamada | ................ | H01L 33/32 |
| 9,484,489 B2* | 11/2016 | Li | ................ | B01J 19/127 |
| 10,361,343 B2* | 7/2019 | Brummer | ................ | H01L 33/06 |
| 10,422,938 B1* | 9/2019 | Rinko | ................ | G02B 6/0028 |

(Continued)

FOREIGN PATENT DOCUMENTS

JP 2006-127924 A 5/2006

OTHER PUBLICATIONS

Liu et al., High-performance deep ultraviolet photodetectors based on few-layer hexagonal boron nitride, Nanoscale, 2018, 10, 5559-5565 (Year: 2018).*

(Continued)

*Primary Examiner* — Earl N Taylor
(74) *Attorney, Agent, or Firm* — Harness, Dickey & Pierce, P.L.C.

(57) ABSTRACT

Provided are an ultraviolet emitting optical device and an operating method thereof. The ultraviolet emitting optical device includes a substrate, a first encapsulation layer, an active layer and a second encapsulation layer sequentially stacked on the substrate, a first electrode layer between the first encapsulation layer and the active layer, a second electrode layer between the active layer and the second encapsulation layer, and color centers provided in the active layer, wherein the active layer includes hexagonal boron nitride (hBN), wherein the color centers are configured to emit light in an ultraviolet wavelength range.

19 Claims, 25 Drawing Sheets

(56) References Cited

U.S. PATENT DOCUMENTS

| | | | |
|---|---|---|---|
| 10,535,801 B2* | 1/2020 | Liao | H01L 33/007 |
| 2016/0240692 A1* | 8/2016 | Shepard | H01L 21/0262 |
| 2017/0294629 A1* | 10/2017 | Kim | H10K 85/211 |
| 2019/0097000 A1* | 3/2019 | Berry | H01L 21/02614 |
| 2021/0172087 A1* | 6/2021 | Hone | C30B 29/68 |
| 2021/0238032 A1* | 8/2021 | Stoughton | B82B 3/0076 |

OTHER PUBLICATIONS

Chae et al., Near Ultraviolet Light Emission in Hexagonal Boron Nitride Based van der Waals Heterostructures, 2019 Conference on Lasers and Electro-Optics (CLEO), San Jose, CA, USA, 2019, pp. 1-2, doi: 10.1364/CLEO_SI.2019.SM10.2. (Year: 2019).*

Shevitski et al., Blue-light-emitting color centers in high-quality hexagonal boron nitride, Physical Review B 100, 155419 (2019) (Year: 2019).*

Molaei et al., A Comprehensive Review on Recent Advances in Two-Dimensional (2D) Hexagonal Boron Nitride, ACS Applied Electronic Materials 2021 3 (12), 5165-5187, DOI: 10.1021/acsaelm.1c00720 (Year: 2021).*

Gichang Noh et al., Stark tuning of single-photon emitters in hexagonal boron nitride, Jun. 22, 2018.

L. Wang et al., One-Dimensional Electrical Contact to a Two-Dimensional Material, Science Nov. 1, 2013: vol. 342, Issue 6158, pp. 614-617.

Y. Kubota et al., Deep Ultraviolet Light-Emitting Hexagonal Boron Nitride Synthesized at Atmospheric Pressure, Science Aug. 17, 2007: vol. 317, Issue 5840, pp. 932-934.

K. Watanabe, T. Taniguchi, Far-UV photoluminescence microscope for impurity domain in hexagonal-boron-nitride single crystals by highpressure, high-temperature synthesis, npj 2D Mater Appl 3, 40 (2019).

G. Cassabois et al., B. Hexagonal boron nitride is an indirect bandgap semiconductor, Nature Photon., 10, 262-266 (2016).

M. Mackoit-Sinkevi?ien? et al.,Carbon dimer defect as a source of the 4.1 eV luminescence in hexagonal boron nitride, Appl. Phys. Lett. 115, 212101 (2019).

K. Watanabe, Direct-bandgap properties and evidence for ultraviolet lasing of hexagonal boron nitride single crystal, Nature Mater. 3, 404-409 (2004).

N. Liu et al., Ultratransparent and stretchable graphene electrodes, Science Advances Sep. 8, 2017: vol. 3, No. 9, e1700159.

N. Mendelson et al., Identifying carbon as the source of visible single-photon emission from hexagonal boron nitride, Nat. Mater. 20, 321-328 (2021).

C. Lyu et al., Single-photon emission from two-dimensional hexagonal boron nitride annealed in a carbon-rich environment, Appl. Phys. Lett. 117, 244002 (2020).

Deng, G. et al. "High-Performance Ultraviolet Light-Emitting Diodes Using n—ZnO/p—hBN/p—GaN Contact Heterojunctions." *ACS Appl. Mater. Interfaces* 2020, 12, 6788-6792.

* cited by examiner

ULTRAVIOLET EMITTING OPTICAL DEVICE AND OPERATING METHOD THEREOF

CROSS-REFERENCE TO RELATED APPLICATIONS

This U.S. non-provisional patent application claims priority under 35 U.S.C. § 119 of Korean Patent Application No. 10-2021-0083673, filed on Jun. 28, 2021, the entire contents of which are hereby incorporated by reference.

BACKGROUND

The present disclosure herein relates to an ultraviolet emitting optical device, and more particularly, to an ultraviolet emitting optical device using hexagonal boron nitride (hBN) and an operating method thereof.

Various optical elements using photonics technology are generally fabricated based on a silicon-on-insulator (SOI) wafer. These optical elements include a light source, a photodetector, an optical modulator, a photodiode, a polarization rotator, a polarization splitter, a wavelength division multiplexer, a wavelength division demultiplexer, an optical power splitter, and the like.

On the other hand, currently used ultraviolet light sources include mercury lamps, UV LEDs, deuterium lamps, and the like. Among them, the mercury lamp emits light in the deep UV region, but when the lamp is heated after several tens of seconds, the light in the deep UV region is weakened and light in the visible region appears. In addition, because of the use of mercury, its use in lighting is banned in many countries. In addition, UV LEDs use semiconductor materials with wide bandgap energy (e.g., AlGaN, AlGaInN, etc.), and these semiconductor materials are difficult to synthesize and require epitaxial growth to generate heterojunction structures or multi-quantum well structures. In addition, since the deuterium lamp operates at a temperature of about 300 degrees, requires preheating, and emits light through arc discharge, it requires a high voltage of about 200 V or more. Accordingly, research on a new UV light source is being actively conducted.

SUMMARY

The present disclosure provides an ultraviolet emitting optical device using hexagonal boron nitride (hBN) and an operating method thereof.

An embodiment of the inventive concept provides an ultraviolet emitting optical device including: a substrate; a first encapsulation layer, an active layer and a second encapsulation layer sequentially stacked on the substrate; a first electrode layer between the first encapsulation layer and the active layer; a second electrode layer between the active layer and the second encapsulation layer; and color centers provided in the active layer, wherein the active layer includes hexagonal boron nitride (hBN), wherein the color centers are configured to emit light in an ultraviolet wavelength range.

In an embodiment, the color centers may be formed when a crystal structure of a partial region of the active layer is modified or some of atoms constituting the first and second electrode layers are implanted into a crystal structure of a partial region of the active layer.

In an embodiment, a partial region of the active layer overlapping the first electrode layer and the second electrode layer in a vertical direction may be defined as a crossing region, wherein the color centers may be provided at positions overlapping an edge of the second electrode layer in the vertical direction in the crossing region.

In an embodiment, a band gap energy of each of the color centers may be 3.3 eV to 6.5 eV.

In an embodiment, the first electrode layer and the second electrode layer may include at least one of graphene, elements such as silicon (Si), magnesium (Mg), carbon (C), and gallium (Ga), metal elements, and transition metal dichalcogenides (TMDC).

In an embodiment, the first encapsulation layer and the second encapsulation layer may include hexagonal boron nitride.

In an embodiment, each of junctions of the first and second electrode layers and the active layer may be a van der Waals heterostructure.

In an embodiment, the first electrode layer may extend in a first direction parallel to an upper surface of the substrate, wherein the second electrode layer may be parallel to an upper surface of the substrate and extend in a second direction intersecting the first direction.

In an embodiment, at least a portion of a side surface of the second electrode layer may have a geometric pattern such as a wave pattern or a sawtooth pattern or a curved shape.

In an embodiment, the first electrode layer may include a first portion extending in a first direction parallel to the upper surface of the substrate and a second portion connected to an end of the first portion, wherein the second electrode layer may include a first portion extending in the first direction and a second portion overlapping the first electrode layer in a vertical direction, wherein the first portion of the first electrode layer may not overlap the first portion of the second electrode layer in the vertical direction.

In an embodiment, the active layer may include a first active layer on the first electrode layer and a second active layer between the first active layer and the second electrode layer, and may further include a third electrode layer between the first active layer and the second active layer.

In an embodiment, the active layer may include first to third active layers sequentially stacked on the first encapsulation layer between the first electrode layer and the second electrode layer, wherein a crystal structure of each of the first to third active layers may extend in different directions.

In an embodiment, the first electrode layer may be provided in plurality, and each of the plurality of first electrode layers may extend in a first direction parallel to an upper surface of the substrate, wherein the second electrode layer may be provided in plurality, and each of the plurality of second electrode layers may extend in a second direction parallel to the upper surface of the substrate and intersecting the first direction, wherein the plurality of first electrode layers may be spaced apart from each other in the second direction at regular intervals, wherein the plurality of second electrode layers may be spaced apart from each other in the first direction at regular intervals.

In an embodiment of the inventive concept, an operating method of an ultraviolet emitting optical device including a substrate, a first encapsulation layer, an active layer and a second encapsulation layer sequentially stacked on the substrate, a first electrode layer between the first encapsulation layer and the active layer, and a second electrode layer between the active layer and the second encapsulation layer includes: applying a first electric field between the first electrode layer and the second electrode layer to form color centers within the active layer; and applying a second electric field between the first electrode layer and the second electrode layer to excite the color centers, wherein the active layer includes hexagonal boron nitride (hBN), wherein the excited color centers emit light in an ultraviolet wavelength range.

In an embodiment, the method may further include controlling an intensity and direction of the second electric field, wherein an intensity of the emitted light may be controlled through controlling the intensity of the second electric field, wherein an emission wavelength may be controlled through controlling the direction of the second electric field.

In an embodiment, controlling the direction of the second electric field may change the direction of the second electric field applied between the first electrode layer and the second electrode layer, wherein changing the direction of the second electric field may change a state in which the first electrode layer is grounded and a voltage is applied to the second electrode layer to a state in which a voltage is applied to the first electrode layer and the second electrode layer is grounded, or vice versa.

In an embodiment, a wavelength change according to changing the direction of the second electric field may be 10 nm to 50 nm.

In an embodiment, a partial region of the active layer overlapping the first electrode layer and the second electrode layer in a vertical direction may be defined as a crossing region, wherein the color centers may be generated at positions overlapping an edge of the second electrode layer in the vertical direction in the crossing region.

In an embodiment, the color centers may be generated at predetermined positions according to a shape and positional relationship of the first electrode layer and the second electrode layer.

In an embodiment, the active layer may include a first active layer on the first electrode layer and a second active layer between the first active layer and the second electrode layer, wherein the ultraviolet emitting optical device may further include a third electrode layer between the first active layer and the second active layer, wherein applying the first electric field or applying the second electric field may be applying a voltage different from that of the third electrode layer to each of the first and second electrode layers.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
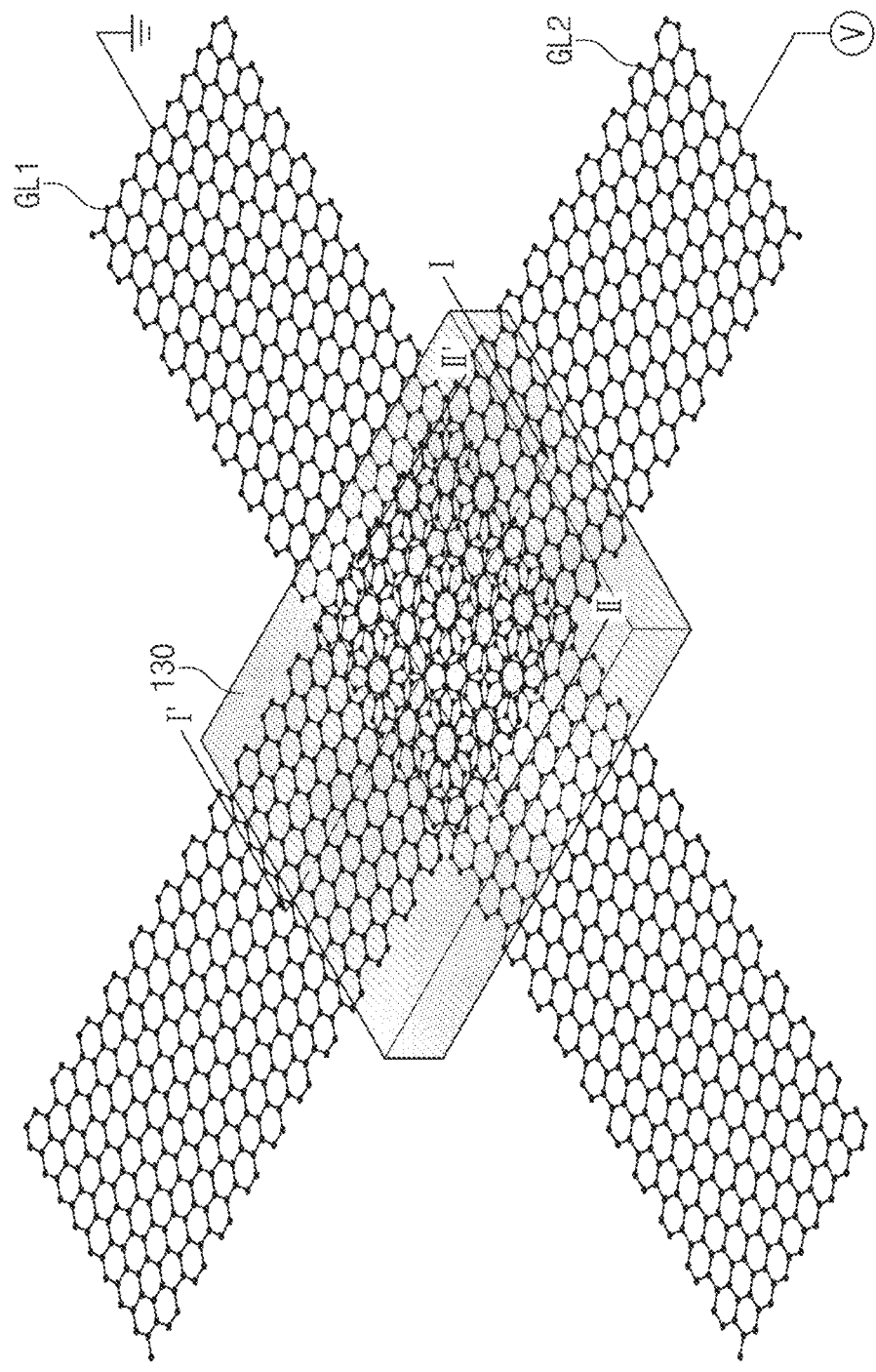
FIG. 1A is a perspective view illustrating an ultraviolet emitting optical device according to embodiments of the inventive concept.

In order to fully understand the configuration and effects of the inventive concept, preferred embodiments of the inventive concept will be described in detail with reference to the accompanying drawings.

The inventive concept is not limited to the embodiments disclosed below, but may be implemented in various forms, and various modifications and changes may be added. However, it is provided to completely disclose the technical idea of the inventive concept through the description of the present embodiments, and to fully inform a person of ordinary skill in the art to which the inventive concept belongs. In the accompanying drawings, for convenience of description, the ratio of each component may be exaggerated or reduced.

The terms used in this specification are for describing embodiments and are not intended to limit the inventive concept. In addition, terms used in the present specification may be interpreted as meanings commonly known to those of ordinary skill in the art, unless otherwise defined.

In this specification, the singular form also includes the plural form unless specifically stated in the phrase. As used in the specification, in relation to 'comprises' and/or 'comprising', the mentioned elements, steps, operations and/or elements do not exclude the presence or addition of one or more other elements, steps, operations and/or elements.

In this specification, terms such as first and second are used to describe various areas, directions, shapes, etc., but these areas, directions, and shapes should not be limited by these terms. These terms are only used to distinguish one area, direction, or shape from another area, direction, or shape. Accordingly, a portion referred to as a first portion in one embodiment may be referred to as a second portion in another embodiment. The embodiments described and illustrated herein also include complementary embodiments thereof. Like reference numerals refer to like elements throughout the specification.

Hereinafter, an ultraviolet emitting optical device and an operating method thereof according to embodiments of the inventive concept will be described in detail with reference to the drawings.

Figure 1B:
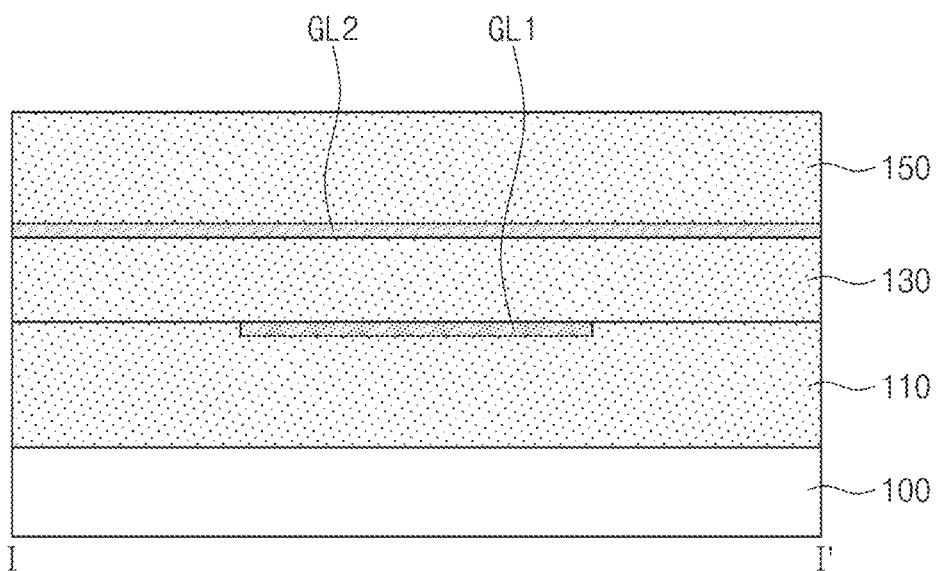
FIG. 1B is a cross-sectional view for explaining an ultraviolet emitting optical device according to embodiments of the inventive concept, and corresponds to a cross-sectional view taken along line I-I' of FIG. 1A.

FIG. 1A is a perspective view illustrating an ultraviolet emitting optical device according to embodiments of the inventive concept. FIG. 1B is a cross-sectional view for explaining an ultraviolet emitting optical device according to embodiments of the inventive concept, and corresponds to a cross-sectional view taken along line I-I' of FIG. 1A.

Referring to FIGS. 1A and 1B, the ultraviolet emitting optical device according to the inventive concept may include a substrate 100, a first encapsulation layer 110, an active layer 130 and a second encapsulation layer 150 stacked sequentially on the substrate 100, a first electrode layer GL1 between the first encapsulation layer 110 and the active layer 130, and a second electrode layer GL2 between the active layer 130 and the second encapsulation layer 150.

The substrate 100 may be, for example, a semiconductor substrate including silicon or a silicon-on-insulator (SOI) substrate including silicon oxide. The substrate 100 may have an upper surface that is parallel to the first direction D1 and the second direction D2 intersecting the first direction D1 and is perpendicular to the third direction D3. The first to third directions D1, D2, and D3 may be, for example, directions orthogonal to each other.

The thickness of the active layer 130 in the third direction D3 may be different from the thickness of each of the first encapsulation layer 110 and the second encapsulation layer 150 in the third direction D3. More specifically, the thickness in the third direction D3 of the active layer 130 may be smaller than the thickness in the third direction D3 of each of the first encapsulation layer 110 and the second encapsulation layer 150.

The first encapsulation layer 110, the active layer 130, and the second encapsulation layer 150 may include, for example, the same material. For example, the first encapsulation layer 110, the active layer 130, and the second encapsulation layer 150 may include hexagonal boron nitride (hBN). Hexagonal boron nitride (hBN) is an isostructural two-dimensional material having a structure equivalent to that of graphene, and is a material that is stable at high temperatures and has an excellent encapsulation effect. As another example, the first encapsulation layer 110 and the second encapsulation layer 150 may include a material different from that of the active layer 130. For example, the active layer 130 may include hexagonal boron nitride (hBN), and the first encapsulation layer 110 and the second encapsulation layer 150 may include a different oxide or nitride.

A thickness of each of the first electrode layer GL1 and the second electrode layer GL2 in the third direction D3 may be smaller than a thickness of the active layer 130 in the third direction D3. The first electrode layer GL1 and the second electrode layer GL2 may have a substantially two-dimensional structure. Each of the junctions of the first and second electrode layers GL1 and GL2 and the active layer 130 may be a van der Waals heterostructure causing strong light-material interaction at the interface thereof.

The first electrode layer GL1 may extend in a first direction D1 parallel to the upper surface of the substrate 100. The first electrode layer GL1 may contact the lower surface of the active layer 130. The first encapsulation layer 110 may cover a lower surface of the first electrode layer GL1.

The second electrode layer GL2 may extend in a second direction D2 that is parallel to the upper surface of the substrate 100 and intersects the first direction D1. However, this is merely exemplary, and the inventive concept is not limited thereto, and as described with reference to FIGS. 7B, 7C, and 7D, the second electrode layer GL2 may extend in the same direction as the first electrode layer GL1. The second electrode layer GL2 may contact the upper surface of the active layer 130. The second encapsulation layer 150 may cover an upper surface of the second electrode layer GL2.

A wiring configured to apply a voltage to each of the first electrode layer GL1 and the second electrode layer GL2 may be connected. Although it is shown in FIG. 1A that the first electrode layer GL1 is grounded and the voltage V is applied to the second electrode layer GL2, this is just an example, and according to the operating method of the ultraviolet emitting optical device according to the inventive concept, conversely, the voltage V may be applied to the first electrode layer GL1 and the second electrode layer GL2 may be grounded.

The first electrode layer GL1 and the second electrode layer GL2 may extend beyond the sidewall of the active layer 130. In other words, a length of the first electrode layer GL1 in the first direction D1 may be greater than a width of the active layer 130 in the first direction D1, and a length of the second electrode layer GL2 in the second direction D2 may be greater than a width of the active layer 130 in the second direction D2. However, this is merely exemplary, and the inventive concept is not limited thereto, and the first electrode layer GL1 and the second electrode layer GL2 may be locally provided on the upper surface of the active layer 130. In other words, a length of the first electrode layer GL1 in the first direction D1 may be substantially the same as a width of the active layer 130 in the first direction D1, and a length of the second electrode layer GL2 in the second direction D2 may be substantially the same as a width of the active layer 130 in the second direction D2. When the first electrode layer GL1 and the second electrode layer GL2 are locally provided on the upper surface of the active layer 130, wiring adjacent to the sidewall of the active layer 130 may be connected to each of the first electrode layer GL1 and the second electrode layer GL2.

For example, the first electrode layer GL1 and the second electrode layer GL2 may include at least one of graphene, elements such as silicon (Si), magnesium (Mg), carbon (C), gallium (Ga), and the like, a metal element, and a transition metal dichalcogenide (TMDC).

Figure 2A:
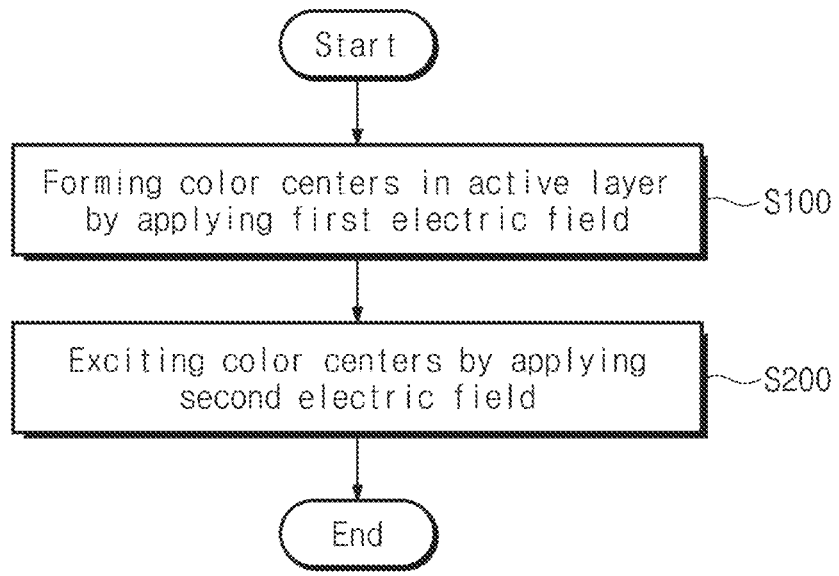
FIGS. 2A and 2B are flowcharts illustrating a method of operating an ultraviolet emitting optical device according to embodiments of the inventive concept.
Figure 2B:
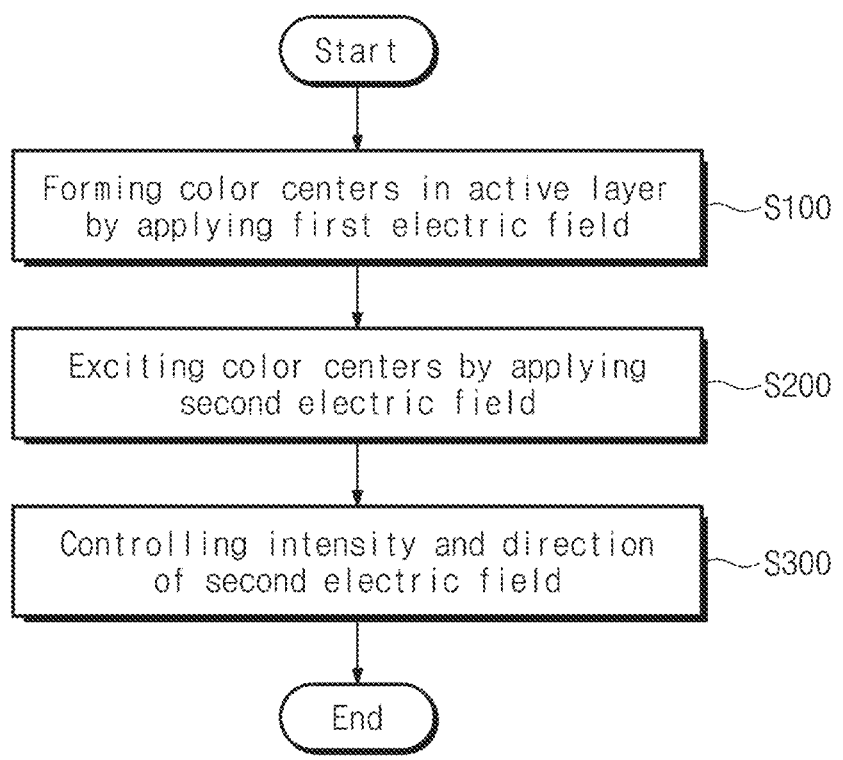

FIGS. 2A and 2B are flowcharts illustrating a method of operating an ultraviolet emitting optical device according to embodiments of the inventive concept. Hereinafter, a method of operating an ultraviolet emitting optical device according to the inventive concept will be described in detail.

Referring to FIG. 2A, a method of operating an ultraviolet emitting optical device according to the inventive concept may include forming color centers in the active layer 130 by applying a first electric field between the first electrode layer GL1 and the second electrode layer GL2 (S100), and applying a second electric field between the first electrode layer GL1 and the second electrode layer GL2 to excite the color centers (S200). Excited color centers may emit light in the ultraviolet wavelength range.

In this case, the color center means a defect state generated in the active layer 130 by the first electric field between the first electrode layer GL1 and the second electrode layer GL2. A defect state inside the active layer 130 may be due to the facts that the crystal structure of the active layer 130 is deformed and/or some of the atoms (e.g., carbon) constituting the first and second electrode layers GL1 and GL2 are injected into the crystal structure of the active layer 130. Each of the defect states may have a band gap energy capable of emitting light in the ultraviolet wavelength range.

The band gap energy of the defect states (i.e., the band gap energy of the color centers) may be, for example, about 3.3 eV to about 6.5 eV. More specifically, the band gap energy of the defect states may be about 3.37 eV, about 4.09 eV, or about 4.62 eV.

Referring to FIG. 2B, a method of operating an ultraviolet emitting optical device according to the inventive concept may include forming color centers in the active layer 130 by applying a first electric field between the first electrode layer GL1 and the second electrode layer GL2 (S100), applying a second electric field between the first electrode layer GL1 and the second electrode layer GL2 to excite the color centers (S200), and controlling the intensity and direction of the second electric field (S300).

In the method of operating an ultraviolet emitting optical device according to the inventive concept, the intensity and emission wavelength of the emitted light may be controlled through the controlling of the intensity and direction of the second electric field (S300). More specifically, the intensity of the emitted light may be controlled by controlling the intensity of the second electric field, and the emission wavelength may be controlled by controlling the direction of the second electric field. The controlling of the direction of the second electric field means changing the direction of the second electric field applied between the first electrode layer GL1 and the second electrode layer GL2. More specifically, changing the direction of the second electric field applied between the first electrode layer GL1 and the second electrode layer GL2 means changing a state in which the first electrode layer GL1 is grounded and a voltage is applied to the second electrode layer GL2 (a forward voltage applied state) into a state in which a voltage is applied to the first electrode layer GL1 and the second electrode layer GL2 is grounded (reverse voltage applied state) or vice versa.

Figure 3A:
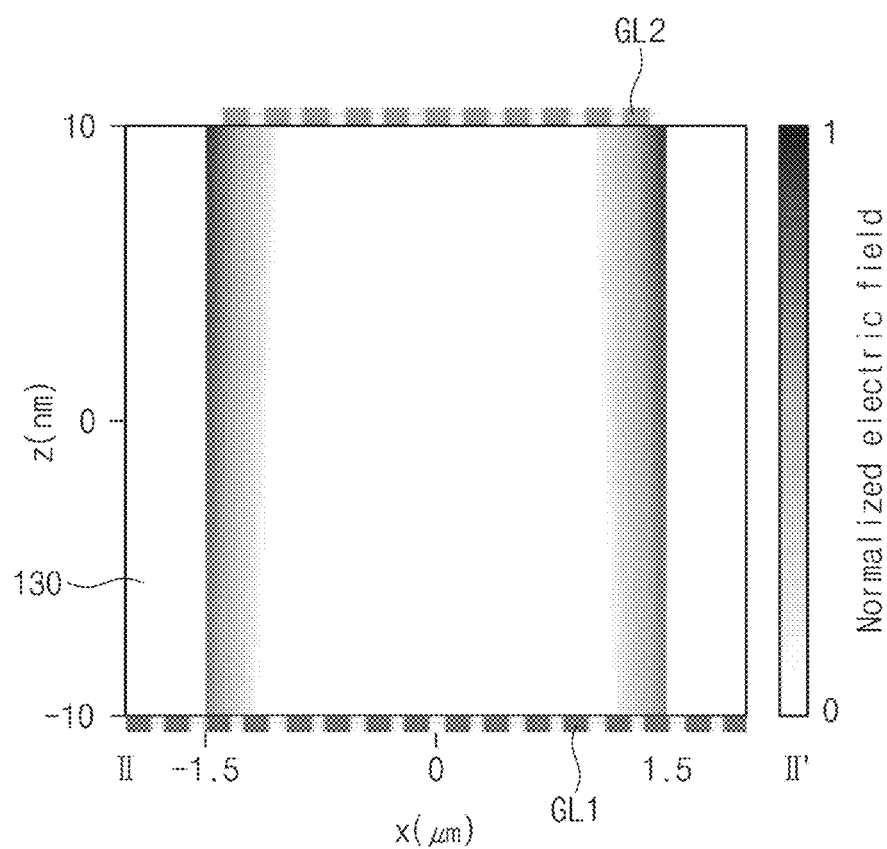
FIGS. 3A and 3B are simulation results illustrating an internal electric field state of an ultraviolet emitting optical device according to embodiments of the inventive concept.
Figure 3B:
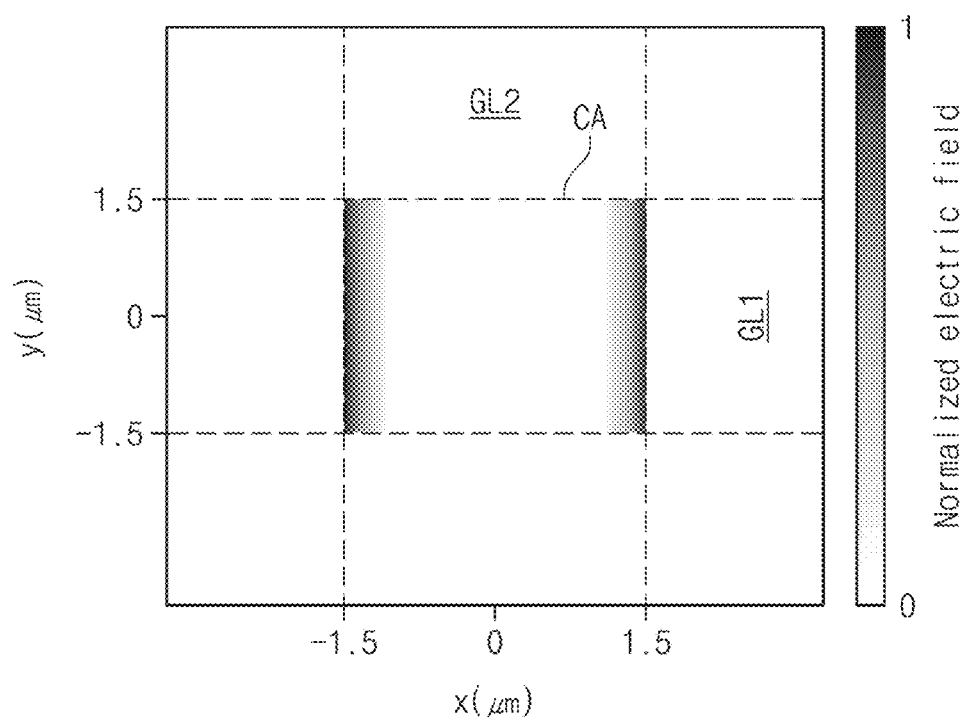

FIGS. 3A and 3B are simulation results illustrating an internal electric field state of an ultraviolet emitting optical device according to embodiments of the inventive concept.

More specifically, FIG. 3A shows an electric field state in a cross-section taken along line II-IT of FIG. 1A, and FIG. 3B shows an electric field state viewed from a vertical direction in FIG. 1A. Referring to FIGS. 3A and 3B, x represents the distance in the first direction D1 based on the center of the active layer 130, y represents the distance in the second direction D2 based on the center of the active layer 130, and z represents a distance in the third direction D3 with respect to the center of the active layer 130. Units of x and y are μm, and units of z are nm. In FIGS. 3A and 3B, the spectrum on the right shows the magnitude of a normalized electric field.

Referring to FIGS. 3A and 3B, an electric field applied to the active layer 130 between the first electrode layer GL1 and the second electrode layer GL2 is illustrated. In particular, referring to FIG. 3B, a strong electric field is applied to the crossing region CA where the first electrode layer GL1 and the second electrode layer GL2 cross (i.e., overlap each other). In addition, an electric field stronger than the center of the crossing region CA is applied to a position in the crossing region CA that overlaps the edge of the second electrode layer GL2 in the vertical direction. Accordingly, color centers may be locally generated at a position in the crossing region CA that overlaps the edge of the second electrode layer GL2 in the vertical direction. That is, according to the inventive concept, color centers may be generated at predetermined (or desired) locations.

FIGS. 4A to 4H are graphs illustrating emission spectra of an ultraviolet emitting optical device according to embodiments of the inventive concept.

Figure 4A:
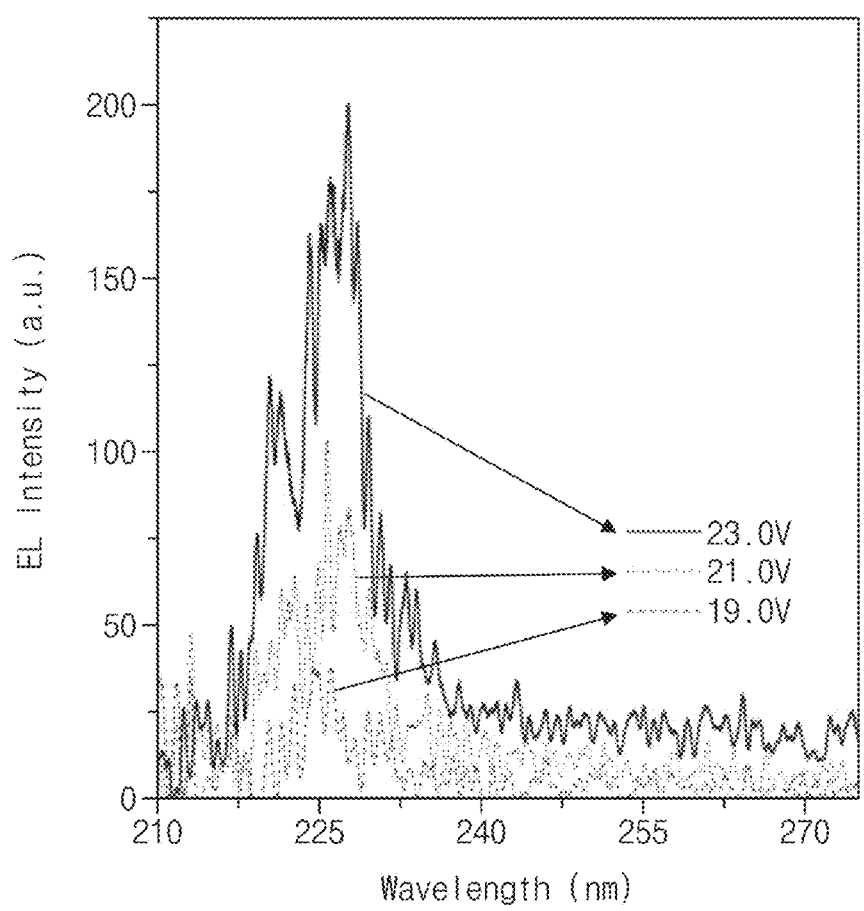
FIGS. 4A to 4H are graphs illustrating emission spectra of an ultraviolet emitting optical device according to embodiments of the inventive concept.
Figure 4B:
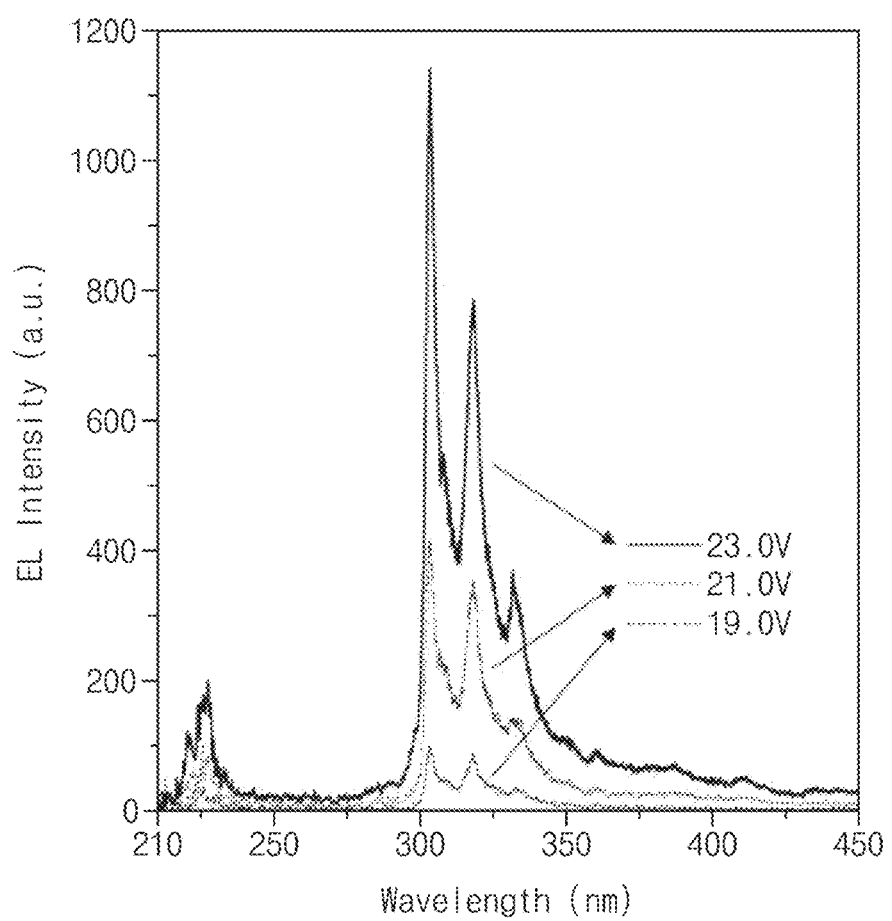

More specifically, FIGS. 4A and 4B show the magnitude of electro-luminescence (EL) with respect to a wavelength when a forward voltage is applied. In this case, referring to FIG. 1A, the forward voltage application means that the first electrode layer GL1 is grounded and the voltage V is applied to the second electrode layer GL2. The emission spectra are measured when the voltage V applied to the second electrode layer GL2 is 19 V, 21 V, and 23 V, respectively.

Figure 4C:
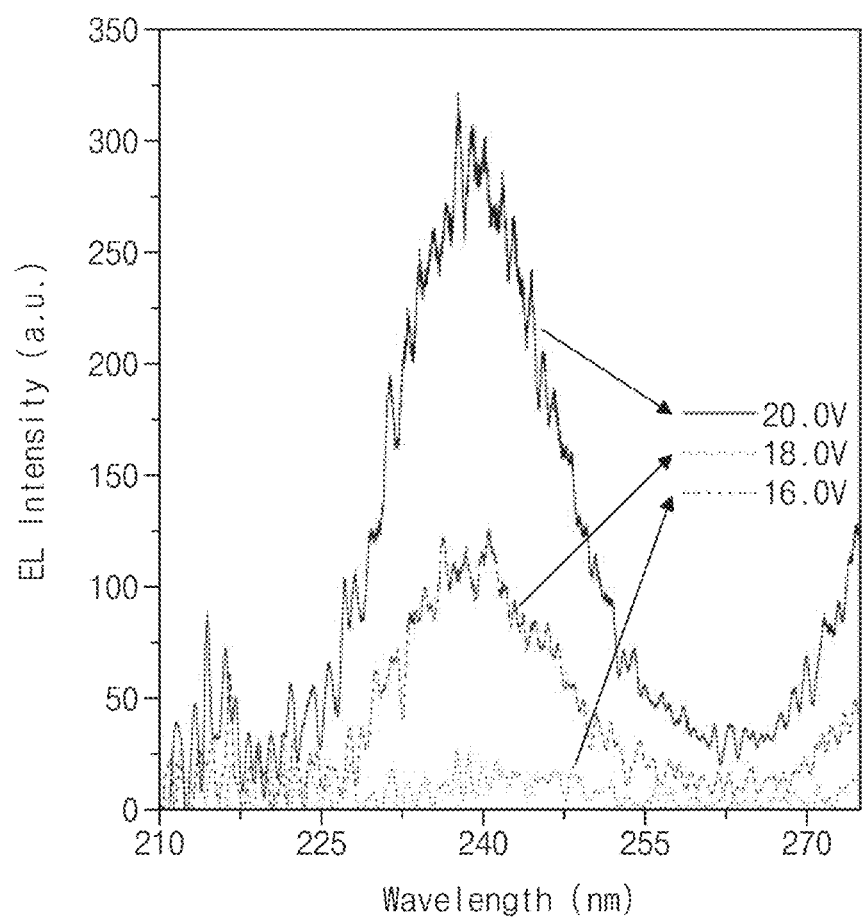
Figure 4D:
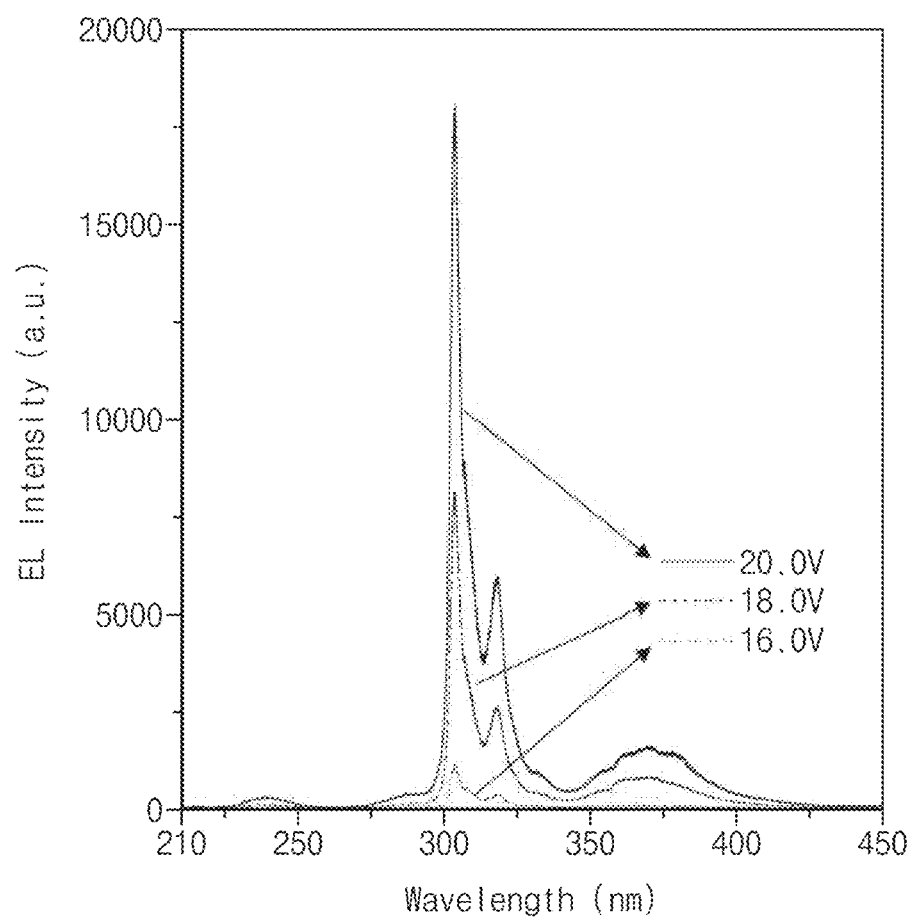

FIGS. 4C and 4D show the magnitude of the electro-luminescence (EL) with respect to the wavelength when a reverse voltage is applied. At this time, referring to FIG. 1A, the reverse voltage application means that the voltage V is applied to the first electrode layer GL1 and the second electrode layer GL2 is grounded as opposed to when the forward voltage is applied. The emission spectra are measured when the voltage V applied to the first electrode layer GL1 is 16 V, 18 V, and 20 V, respectively.

Figure 4E:
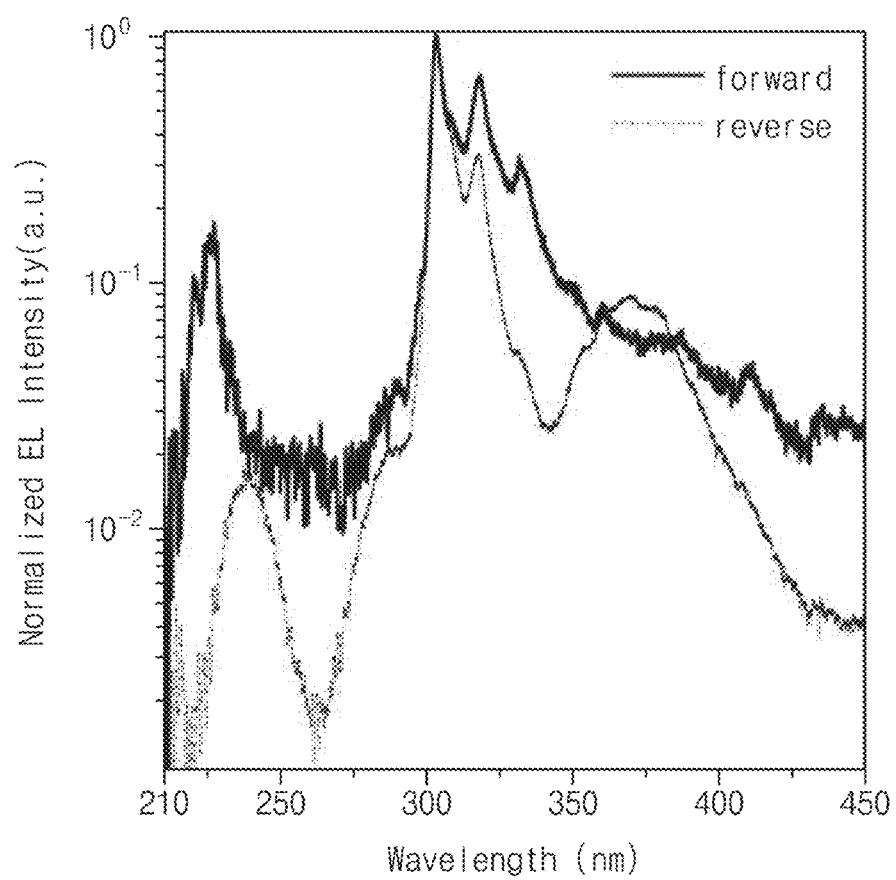
Figure 4F:
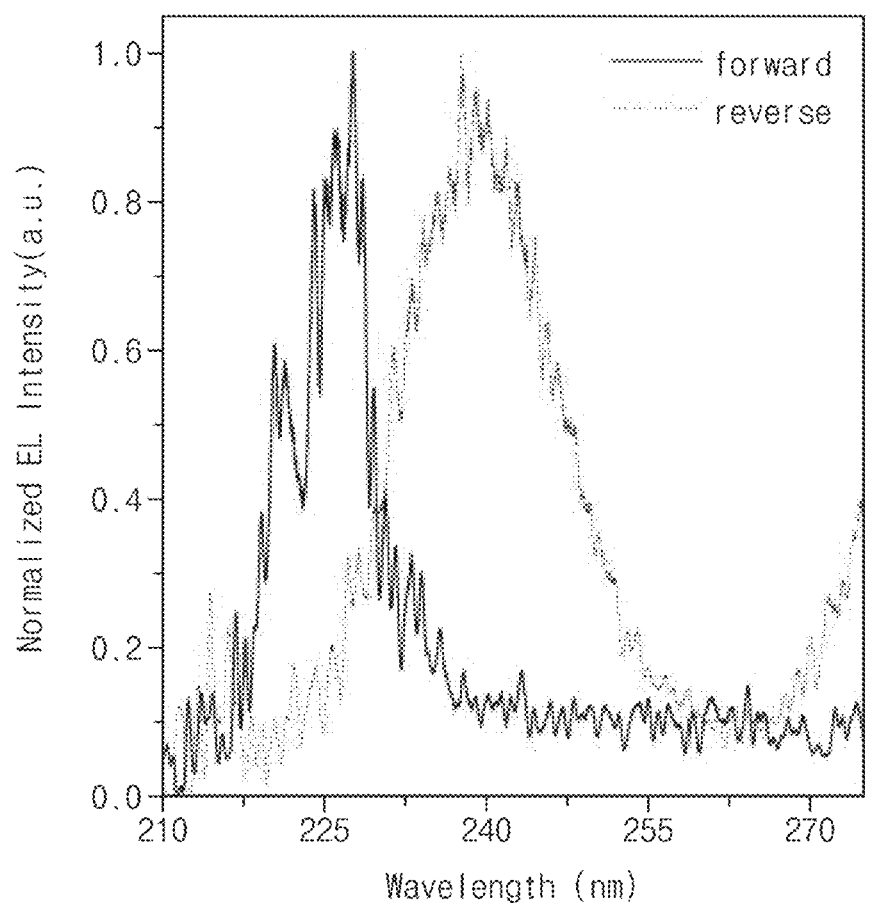
Figure 4G:
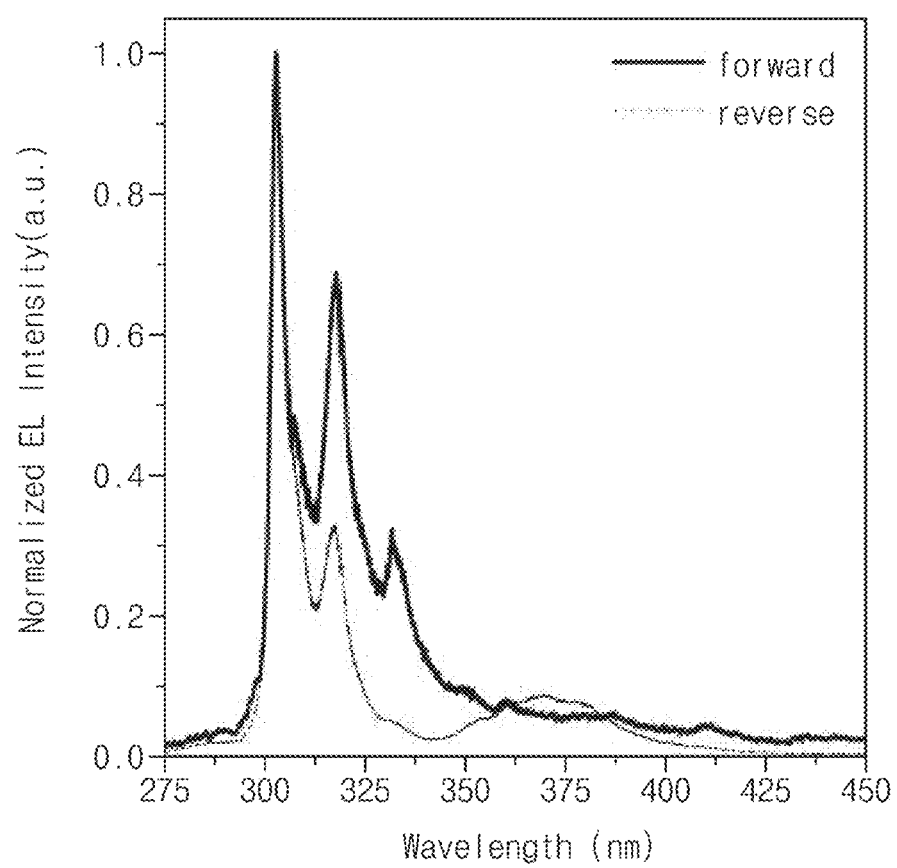

FIGS. 4E, 4F, and 4G show the magnitude of normalized electro-luminescence (EL) with respect to wavelength when a forward voltage is applied and when a reverse voltage is applied. FIG. 4E shows the normalized electro-luminescence (EL) size for a wavelength range of about 200 nm to about 450 nm, and FIGS. 4F and 4G show the normalized electro-luminescence (EL) magnitudes for a portion (FIG. 4*f* is about 200 nm to about 275 nm, and FIG. 4*g* is about 275 nm to about 450 nm) of the wavelength range of FIG. 4*e*, respectively.

Referring to FIGS. 4A to 4G, when a forward voltage is applied, the emission spectrum includes emission peaks of about 215 nm, about 225 nm, about 303 nm, about 317 nm, and about 333 nm, and when a reverse voltage is applied, the emission spectrum includes emission peaks of about 215 nm, about 245 nm, about 303 nm, about 317 nm, and about 375 nm. The emission peaks are located within the ultraviolet wavelength range. At this time, the 215 nm peak and the peaks within the wavelength range of about 220 nm to about 250 nm correspond to the band gap energy of hexagonal boron nitride (hBN), and the 303 nm peak, the 317 nm peak, and the 333 nm peak correspond to the band gap energies of the color centers.

When changing from a forward voltage application to a reverse voltage application (i.e., changing the direction of the electric field), the 225 nm peak changes to a 245 nm peak (Δ=20 nm). However, this is an example, and when changing from a forward voltage application to a reverse voltage application, the change in wavelength may be about 10 nm to about 50 nm.

Referring to FIGS. 4B and 4D by comparison, when changing from a forward voltage application to a reverse voltage application, in the wavelength range of about 300 nm to about 350 nm, the magnitude of electro-luminescence (EL) (i.e., luminous efficiency (or quantum efficiency)) increases by about 10 times or more.

Figure 4H:
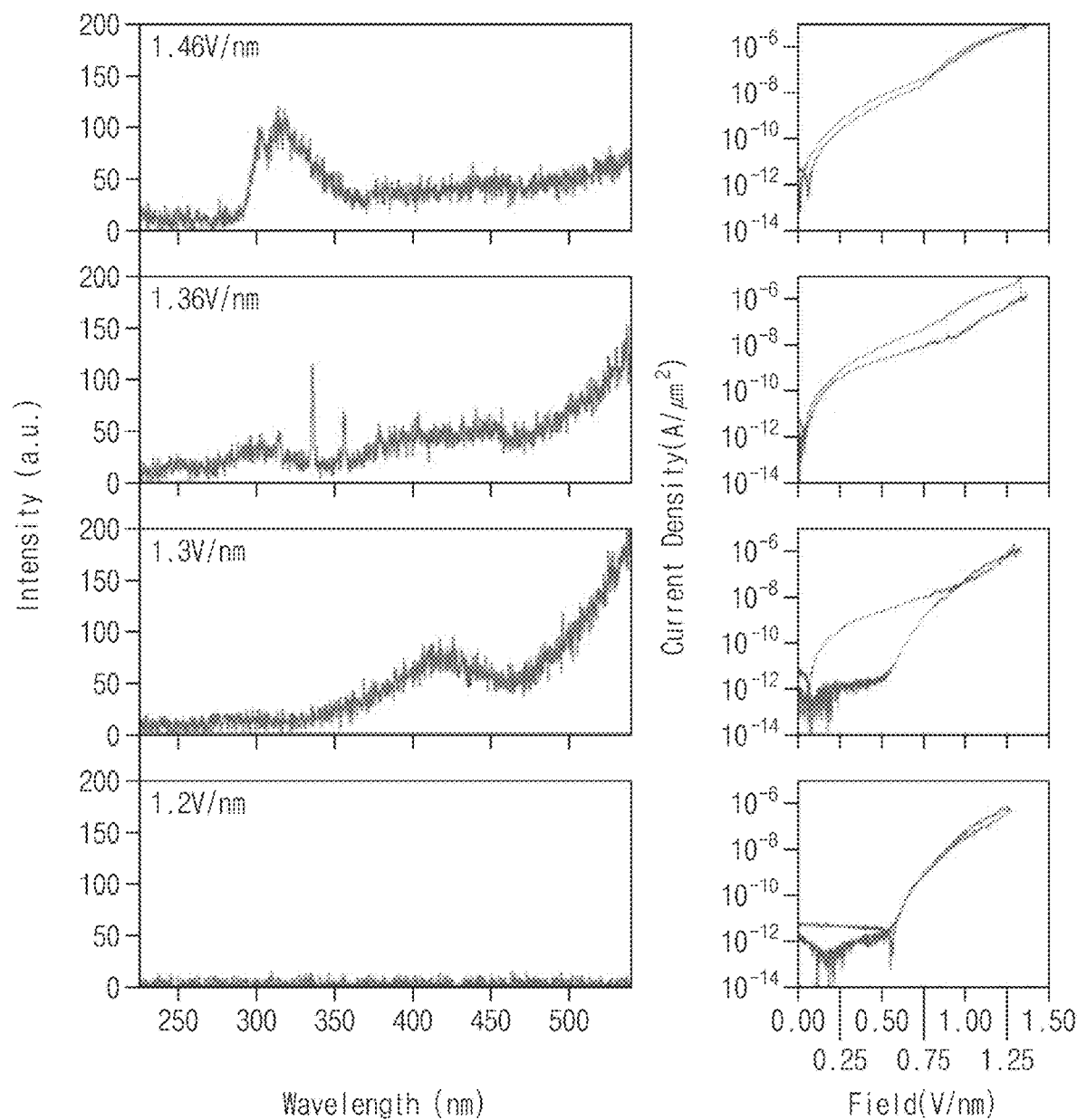

FIG. 4H shows the emission spectrum and the current density of the tunneling current according to the magnitude of the applied electric field. Graphs of emission spectra and current density of tunneling current were measured when the magnitude of the applied electric field was about 1.2 V/nm, about 1.3 V/nm, about 1.36 V/nm, and about 1.46 V/nm, respectively At this time, the measurement is performed while gradually increasing the magnitude of the electric field. At this time, the unit of the magnitude of the electric field is V/nm, and the unit of the current density is A/μm$^2$.

Referring to FIG. 4H, emission is observed in a wavelength range of about 400 nm to about 450 nm when the magnitude of the electric field is about 1.3 V/nm. Although not shown in the drawing, the tunneling current starts to increase when the electric field is about 0.7 V/nm.

When the magnitude of the electric field is about 1.36 V/nm, emission peaks are observed in the emission spectrum. The emission peaks mean that color centers are generated in the active layer 130 (refer to FIG. 1A).

When the magnitude of the electric field is about 1.46 V/nm, light emission is observed in a wavelength range of about 300 nm to 350 nm, and although not shown in the drawing, when an electric field greater than 1.46 V/nm is applied, emission is observed in the wavelength range of about 215 nm and about 225 nm to about 245 nm. In the above, the graphs described with reference to FIGS. 4A to 4G are measured when the first electrode layer GL1 and the second electrode layer GL2 include graphene. However, this is only an example, and the first electrode layer GL1 and the second electrode layer GL2 may include an element such as silicon (Si), magnesium (Mg), carbon (C), gallium (Ga), and the like, a metal element, or a transition metal dichalcogenide (TMDC). For example, when the first electrode layer GL1 and the second electrode layer GL2 include a metal element or a transition metal dichalcogenide (TMDC), the emission peaks may be located within a wavelength range of about 210 nm to about 250 nm. As another example, when the first electrode layer GL1 and the second electrode layer GL2 include carbon (C), they may have an emission peak of about 303 nm. As another example, when the first electrode layer GL1 and the second electrode layer GL2 include gallium (Ga), they may have an emission peak of about 280 nm.

Since the ultraviolet emitting optical device according to the inventive concept emits ultraviolet light in the UVC region (wavelength range of about 200 nm to about 280 nm), it may be used in an ultraviolet sterilizer.

Figure 5A:
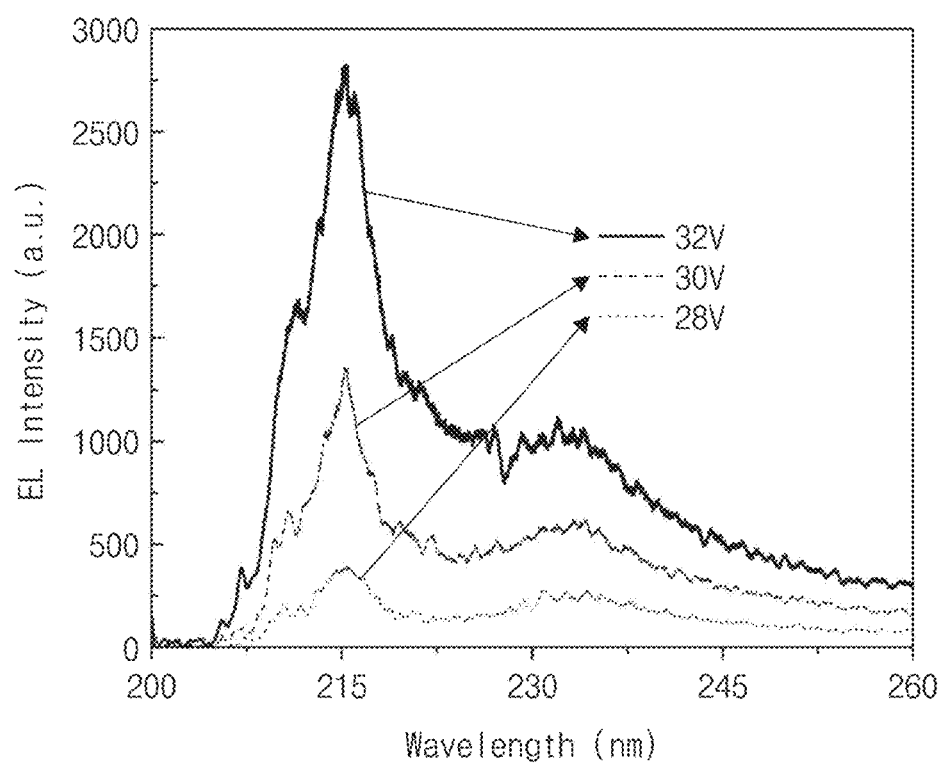
FIGS. 5A and 5B are graphs illustrating emission spectra of an ultraviolet emitting optical device according to other embodiments of the inventive concept.
Figure 5B:
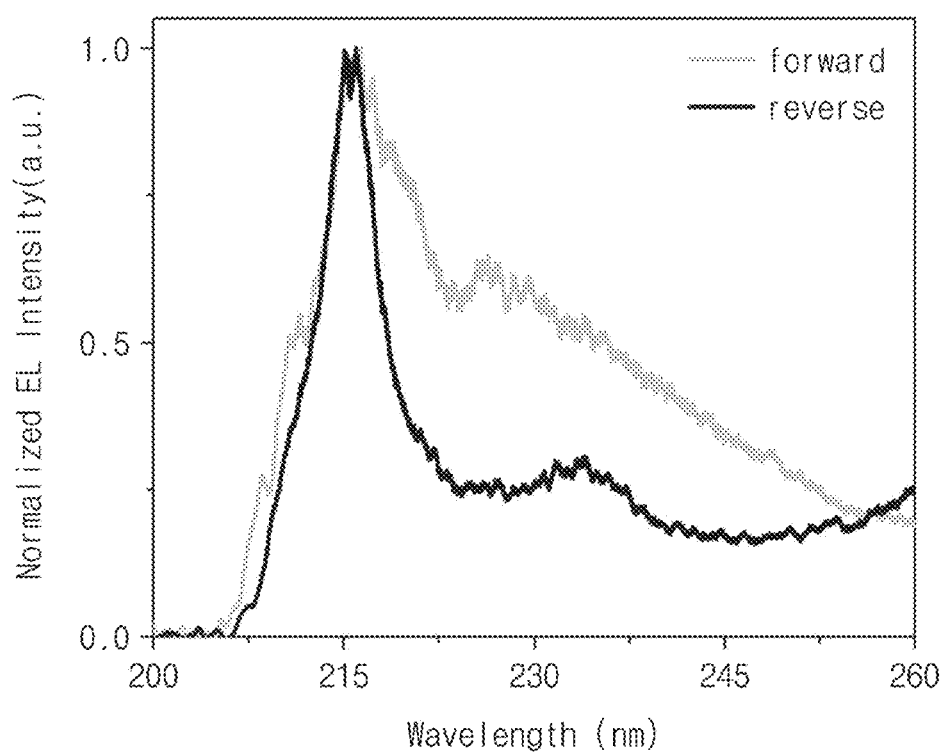

FIGS. 5A and 5B are graphs illustrating emission spectra of an ultraviolet emitting optical device according to other embodiments of the inventive concept.

More specifically, FIG. 5A show the magnitude of electro-luminescence (EL) with respect to a wavelength when a forward voltage is applied. The emission spectra are measured when the voltage V applied to the second electrode layer GL2 is 28 V, 30 V, and 32 V, respectively. FIG. 5B show the magnitude of normalized electro-luminescence (EL) with respect to wavelength when a forward voltage is applied and when a reverse voltage is applied. FIG. 5B shows the normalized electro-luminescence (EL) size for a wavelength range of about 200 nm to about 260 nm.

Referring to FIGS. 5A and 5B, when a forward voltage is applied, the emission spectrum includes emission peaks of about 208 nm, about 215 nm, about 218 nm, and about 225 nm, and when a reverse voltage is applied, the emission spectrum includes emission peaks of about 215 nm, and about 235 nm. The emission peaks are located within the ultraviolet wavelength range. At this time, the peaks within the wavelength range of about 200 nm to about 240 nm correspond to the band gap energy of hexagonal boron nitride (hBN). The 215 nm peak may have greater intensity than other peaks. Electrons and holes may be injected into the hBN by graphene, and thus, the 215 nm peak corresponding to the optical bandgap energy of the hBN may be relatively strong.

Figure 6A:
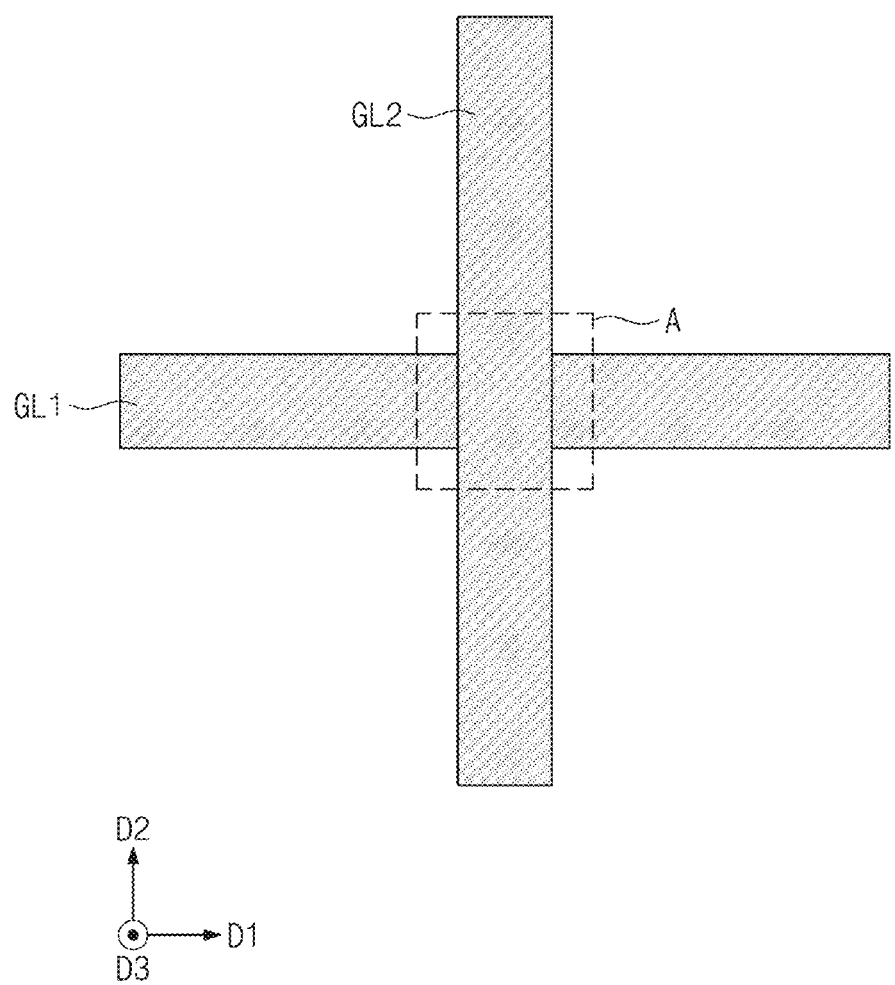
FIGS. 6A and 6B are plan views illustrating a crossing region of first and second electrode layers of an ultraviolet emitting optical device according to embodiments of the inventive concept, and FIG. 6B corresponds to part A of FIG. 6A.
Figure 6B:
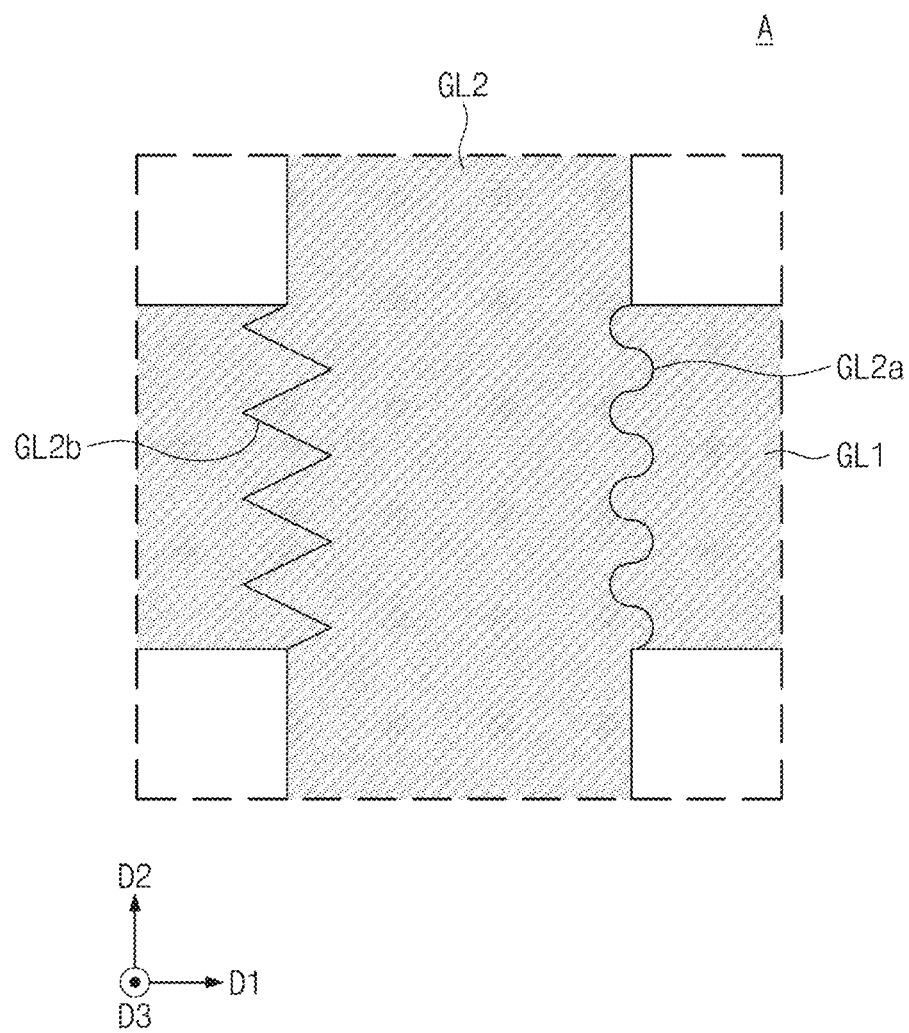

FIGS. 6A and 6B are plan views illustrating a crossing region of first and second electrode layers of an ultraviolet emitting optical device according to embodiments of the inventive concept, and FIG. 6B corresponds to part A of FIG. 6A.

Referring to FIGS. 6A and 6B, at least a portion of a side surface of the second electrode layer GL2 may have a geometric pattern such as a wave pattern or a sawtooth (wheel) pattern. The geometric pattern of the side surface of the second electrode layer GL2 may be provided at a position overlapping the first electrode layer GL1 in the third direction D3. For example, the first surface GL2a of the second electrode layer GL2 may have a wave pattern, and the second surface GL2b of the second electrode layer GL2 may have a sawtooth pattern, but this is merely exemplary, and the inventive concept is not limited thereto. As another example, both of the first and second surfaces GL2a and GL2b may have a wave pattern, or both of the first and second surfaces GL2a and GL2b may have a sawtooth pattern. Each of the first and second surfaces GL2a and GL2b is not limited to what is illustrated and/or described and may have various patterns other than straight lines.

Referring to FIG. 3B together, as a part of the side surface of the second electrode layer GL2 has various patterns, compared to a case where the side surface of the second electrode layer GL2 has a straight profile, the number of color centers generated at a position vertically overlapping with the edge of the second electrode layer GL2 may be increased in the crossing region CA.

FIGS. 7A to 7E are plan views illustrating shapes of first and second electrode layers of an ultraviolet emitting optical device according to embodiments of the inventive concept.

Figure 7A:
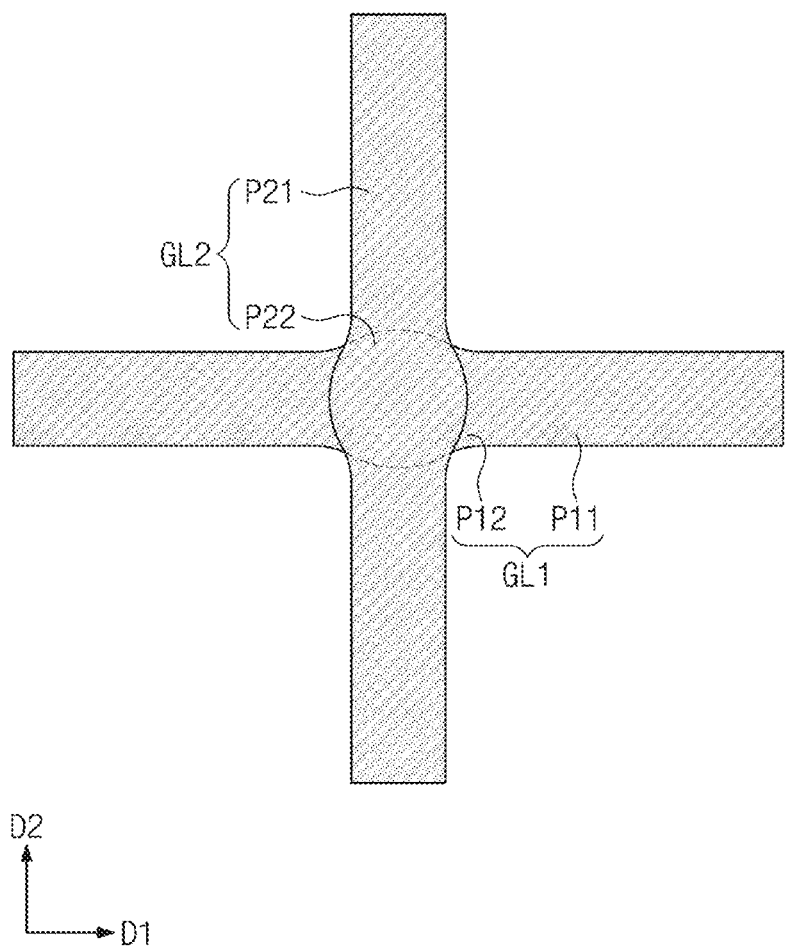
FIGS. 7A to 7E are plan views illustrating shapes of first and second electrode layers of an ultraviolet emitting optical device according to embodiments of the inventive concept.

Referring to FIG. 7A, the first electrode layer GL1 may include first portions P11 having a constant width in the second direction D2 and a second portion P12 vertically overlapping with the second electrode layer GL2. The second electrode layer GL2 may include first portions P21 having a constant width in the first direction D1 and a second portion P22 vertically overlapping with the first electrode layer GL1. The first portions P11 of the first electrode layer GL1 may extend from both sides of the second portion P12 in the first direction D1. The first portions P21 of the second electrode layer GL2 may extend from both sides of the second portion P22 in the second direction D2. Each side surface of the second portion P12 of the first electrode layer GL1 and the second portion P22 of the second electrode layer GL2 may have a curved shape. When an electric field is applied between the first electrode layer GL1 and the second electrode layer GL2, the color centers may be formed at positions overlapping the side surface of the second portion P22 of the second electrode layer GL2 in the vertical direction.

Figure 7B:
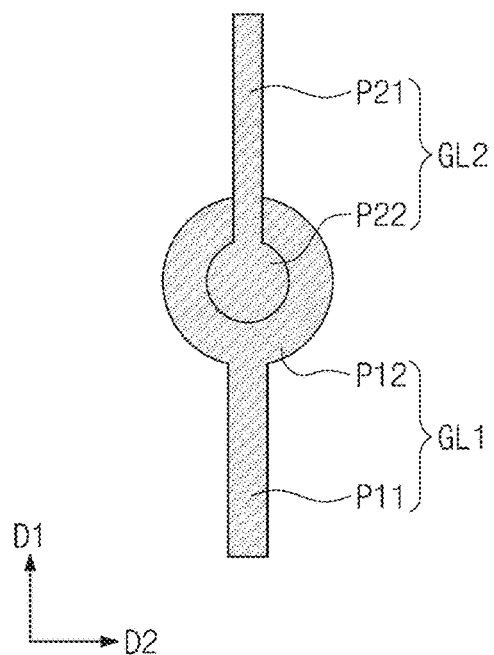

Referring to FIG. 7B, the first electrode layer GL1 may include a first portion P11 extending in the first direction D1 and having a constant width in the second direction D2 and a second portion P12 connected to an end of the first portion P11 and having a circular shape. The second electrode layer GL2 may include a first portion P21 extending in the first direction D1 and having a constant width in the second direction D2 and a second portion P22 connected to an end of the first portion P21 and having a circular shape. The first portion P11 of the first electrode layer GL1 and the first portion P21 of the second electrode layer GL2 may extend in the same direction, but may not overlap each other in a vertical direction. A diameter of the second portion P12 of the first electrode layer GL1 may be greater than a diameter of the second portion P22 of the second electrode layer GL2. The second portion P22 of the second electrode layer GL2 may vertically overlap the second portion P12 of the first electrode layer GL1. When an electric field is applied between the first electrode layer GL1 and the second electrode layer GL2, the color centers may be formed at positions overlapping the circumference of the second portion P22 of the second electrode layer GL2 in the vertical direction.

Figure 7C:
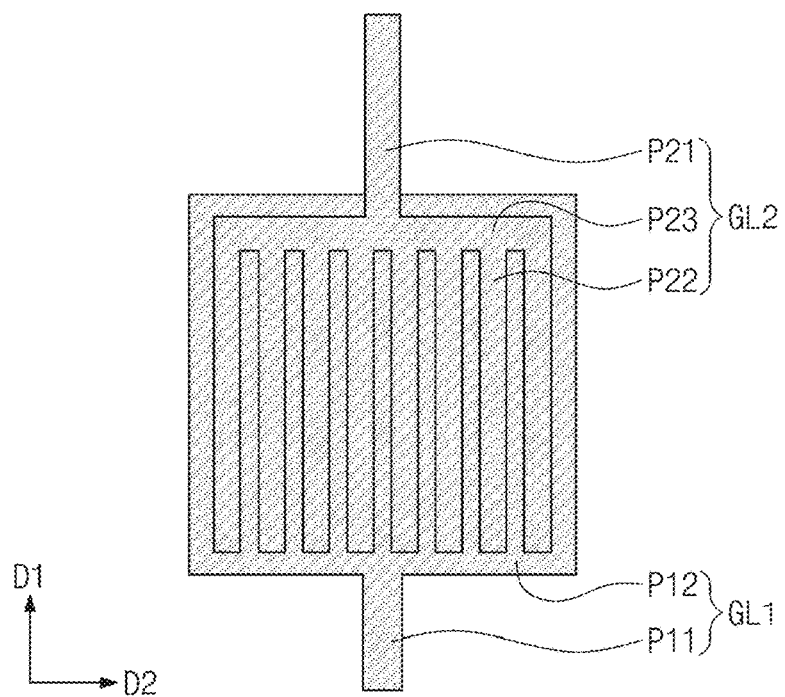

Referring to FIG. 7C, the first electrode layer GL1 may include a first portion P11 extending in the first direction D1 and a second portion P12 connected to an end of the first portion P11 and having a rectangular shape. A width of the second portion P12 of the first electrode layer GL1 in the second direction D2 may be greater than a width of the first portion P11 in the second direction D2. The second electrode layer GL2 may include a first portion P21 extending in a first direction D1, a plurality of second portions P22 vertically overlapping the first electrode layer GL1 and extending in the first direction D1, and a third portion P23 vertically overlapping with the first electrode layer GL1 and extending in the second direction D2. The first portion P11 of the first electrode layer GL1 and the first portion P21 of the second electrode layer GL2 may extend in the same direction, but may not overlap each other in a vertical direction. The third portion P23 of the second electrode layer GL2 may be provided between the first portion P21 and the second portions P22, and may connect the first portion P21 and the second portions P22. The second portions P22 and the third portion P23 of the second electrode layer GL2 may form a comb shape. When an electric field is applied between the first electrode layer GL1 and the second electrode layer GL2, color centers may be formed at positions vertically overlapping side surfaces of the second portions P22 and the third portion P23 of the second electrode layer GL2.

Figure 7D:
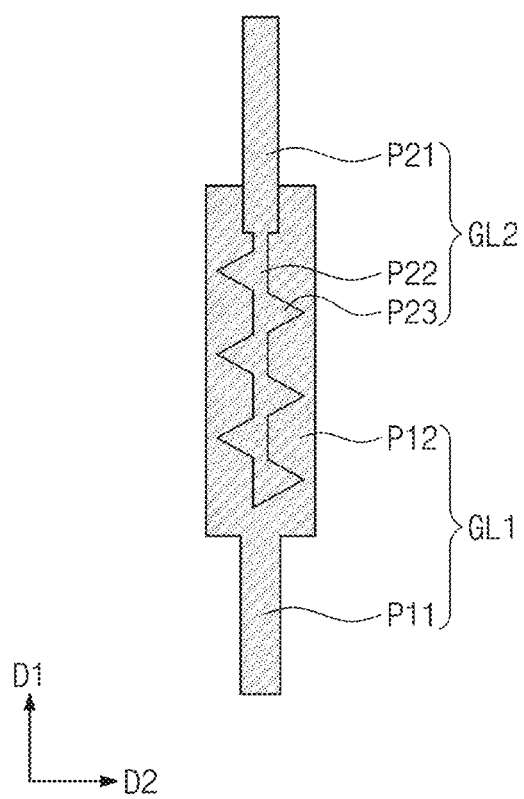

Referring to FIG. 7D, the first electrode layer GL1 may include a first portion P11 extending in the first direction D1 and a second portion P12 connected to an end of the first portion P11 and having a rectangular shape. A width of the second portion P12 of the first electrode layer GL1 in the second direction D2 may be greater than a width of the first portion P11 in the second direction D2. The second electrode layer GL2 may include a first portion P21 extending in a first direction D1, a second portion P22 connected to an end of the first portion P21 and extending in the first direction D1, and a plurality of third portions P23 protruding from the second portion P22 in the second direction D2. A width of the second portion P22 of the second electrode layer GL2 in the second direction D2 may be smaller than a width of the first portion P21 in the second direction D2. The second portion P22 and the third portions P23 of the second electrode layer GL2 may vertically overlap the first electrode layer GL1. Although the third portions P23 of the second electrode layer GL2 are illustrated to have a triangular shape, this is merely exemplary and the inventive concept is not limited thereto, and the third portions P23 may have various shapes. When an electric field is applied between the first electrode layer GL1 and the second electrode layer GL2, color centers may be formed at positions overlapping side surfaces of the third portions P23 of the second electrode layer GL2 in a vertical direction.

Figure 7E:
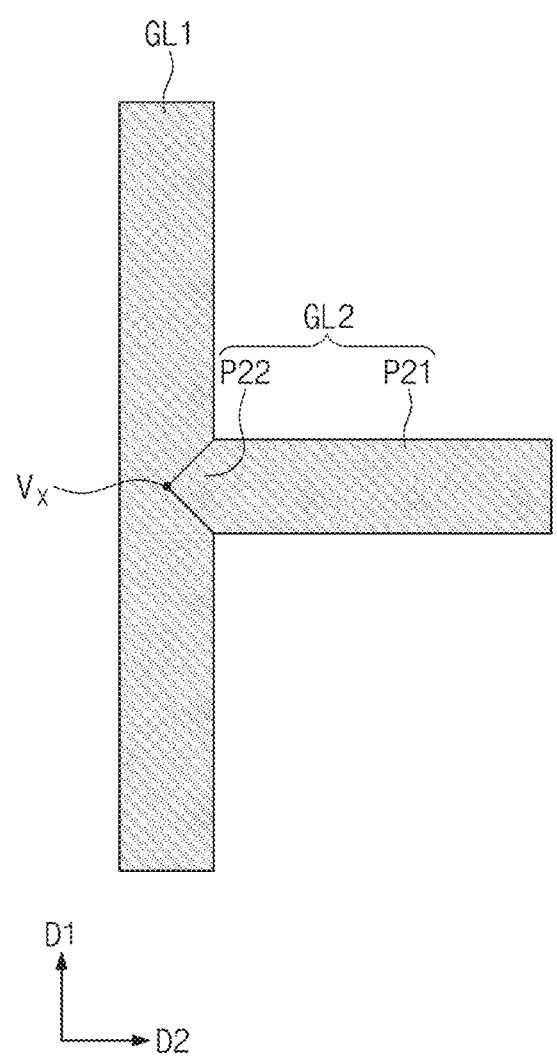

Referring to FIG. 7E, the first electrode layer GL1 may extend in the first direction D2. The second electrode layer GL2 may include a first portion P21 extending in the second direction D2; and a second portion P22 connected to an end of the first portion P21 and overlapping the first electrode layer GL1 in a vertical direction. The second portion P22 may have, for example, a triangular shape in which the vertex Vx is positioned on the first electrode layer GL1. However, this is merely exemplary, and the inventive concept is not limited thereto, and the second portion P22 may have various shapes such as an ellipse or a polygon other than a triangle. When an electric field is applied between the first electrode layer GL1 and the second electrode layer GL2, color centers may be formed at positions, particularly near the vertices Vx, overlapping the side surfaces of the second portion P22 of the second electrode layer GL2 in the vertical direction.

What has been described with reference to FIGS. 7A to 7E is exemplary only, and the inventive concept is not limited thereto, and by variously setting the shape and positional relationship of the first electrode layer GL1 and the second electrode layer GL2 as described above, it is possible to widen the area in which the color centers are created, and further generate the color centers at a predetermined (or desired) location.

Figure 8:
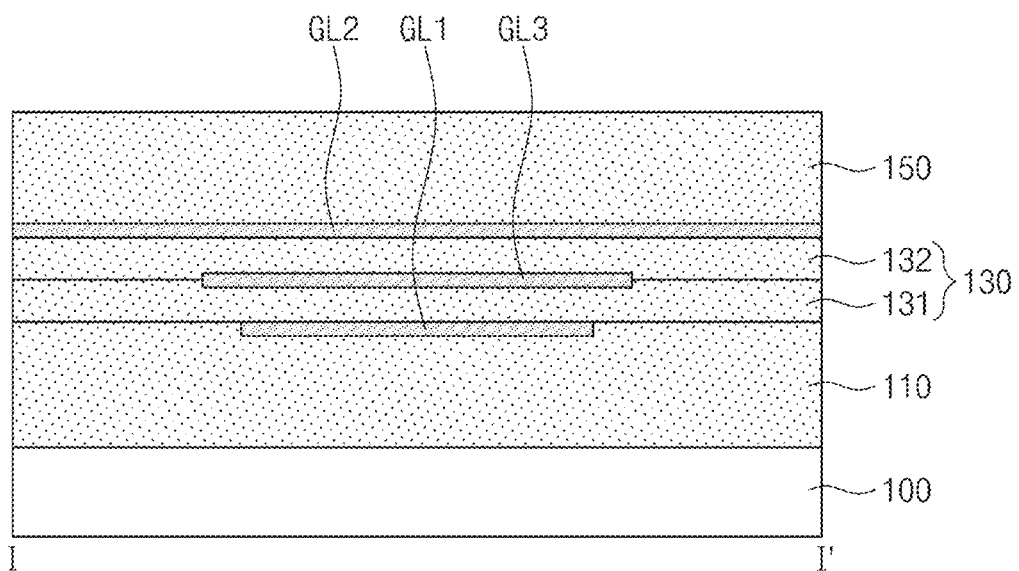
FIGS. 8 and 9A are cross-sectional views illustrating an ultraviolet emitting optical device according to embodiments of the inventive concept, and respectively correspond to a cross-section taken along the line I-I' of FIG. 1A.

FIG. 8 is a cross-sectional view for explaining an ultraviolet emitting optical device according to embodiments of the inventive concept, and corresponds to a cross-sectional view taken along line I-I' of FIG. 1A. Hereinafter, for convenience of explanation, descriptions of substantially the same matters as those described with reference to FIGS. 1A and 1B will be omitted, and differences will be described in detail.

Referring to FIG. 8, the active layer 130 may include a first active layer 131 and a second active layer 132. The first active layer 131 may be in contact with the upper surface of the first encapsulation layer 110 and/or the upper surface of the first electrode layer GL1. The second active layer 132 may be in contact with a lower surface of the second encapsulation layer 150 and/or a lower surface of the second electrode layer GL2. The first active layer 131 may be provided between the second active layer 132 and the first encapsulation layer 110. The second active layer 132 may be provided between the first active layer 131 and the second encapsulation layer 150.

The ultraviolet emitting optical device according to the inventive concept may further include a third electrode layer GL3 between the first active layer 131 and the second active layer 132. The third electrode layer GL3 may include substantially the same material as the first and second electrode layers GL1 and GL2. When a voltage different from that of the third electrode layer GL3 is applied to each of the first and second electrode layers GL1 and GL2, electro-luminescence may occur in both the first active layer 131 and the second active layer 132.

Referring to FIG. 1A again, for example, the first electrode layer GL1 may extend in the first direction D1, the second electrode layer GL2 may extend in the second direction D2, and the third electrode layer GL3 may extend in a horizontal direction crossing each of the first direction D1 and the second direction D2. As another example, the first electrode layer GL1 and the second electrode layer GL2 may extend in the first direction D1, and the third electrode layer GL3 may extend in the second direction D2.

Figure 9A:
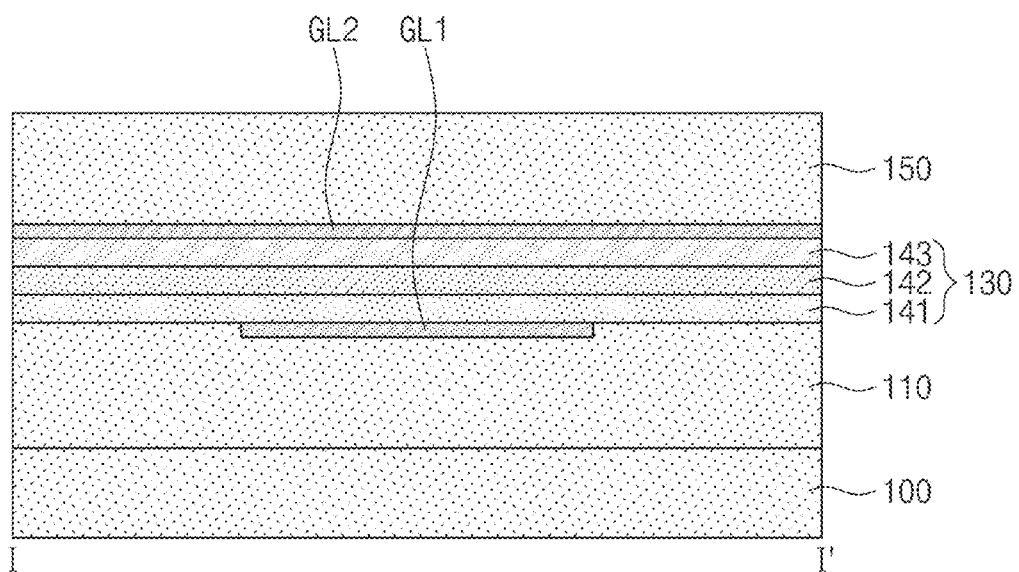
Figure 9B:
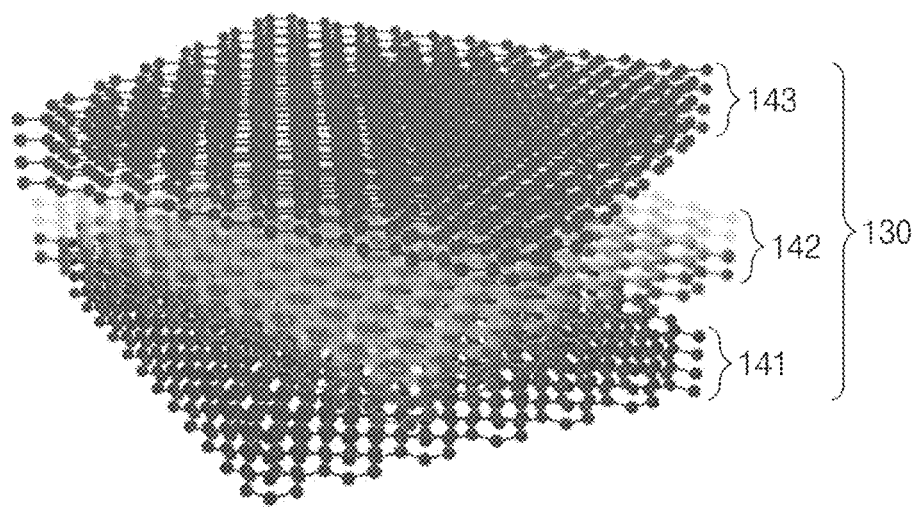
FIG. 9B is a perspective view illustrating an active layer of the ultraviolet emitting optical device of FIG. 9A.

FIG. 9A is a cross-sectional view for explaining an ultraviolet emitting optical device according to embodiments of the inventive concept, and corresponds to a cross-sectional view taken along line I-I' of FIG. 1A. FIG. 9B is a perspective view illustrating an active layer of the ultraviolet emitting optical device of FIG. 9A. Hereinafter, for convenience of explanation, descriptions of substantially the same matters as those described with reference to FIGS. 1A and 1B will be omitted, and differences will be described in detail.

Referring to FIG. 9A, the active layer 130 may include a first active layer 141, a second active layer 142, and a third active layer 143 sequentially stacked on the first encapsulation layer 110 between the first electrode layer GL1 and the second electrode layer GL2. The first active layer 141 may be in contact with the upper surface of the first encapsulation layer 110 and/or the upper surface of the first electrode layer GL1. The second active layer 142 may be provided between the first active layer 141 and the third active layer 143. The third active layer 143 may be in contact with a lower surface of the second encapsulation layer 150 and/or a lower surface of the second electrode layer GL2.

Referring to FIG. 9B, crystal structures of the first to third active layers 141, 142, and 143 may extend in different directions. Specifically, the direction in which the crystal structure of the first active layer 141 extends may form a predetermined angle with the direction in which the crystal structure of the second active layer 142 extends, and the direction in which the crystal structure of the second active layer 142 extends may form a predetermined angle with the direction in which the crystal structure of the third active layer 143 extends.

The first active layer 141 in contact with the first electrode layer GL1 and the third active layer 143 in contact with the second electrode layer GL2 may help inject electrons or holes into the second active layer 142, so that the luminous efficiency of the ultraviolet emitting optical device according to the inventive concept may be improved.

Figure 10A:
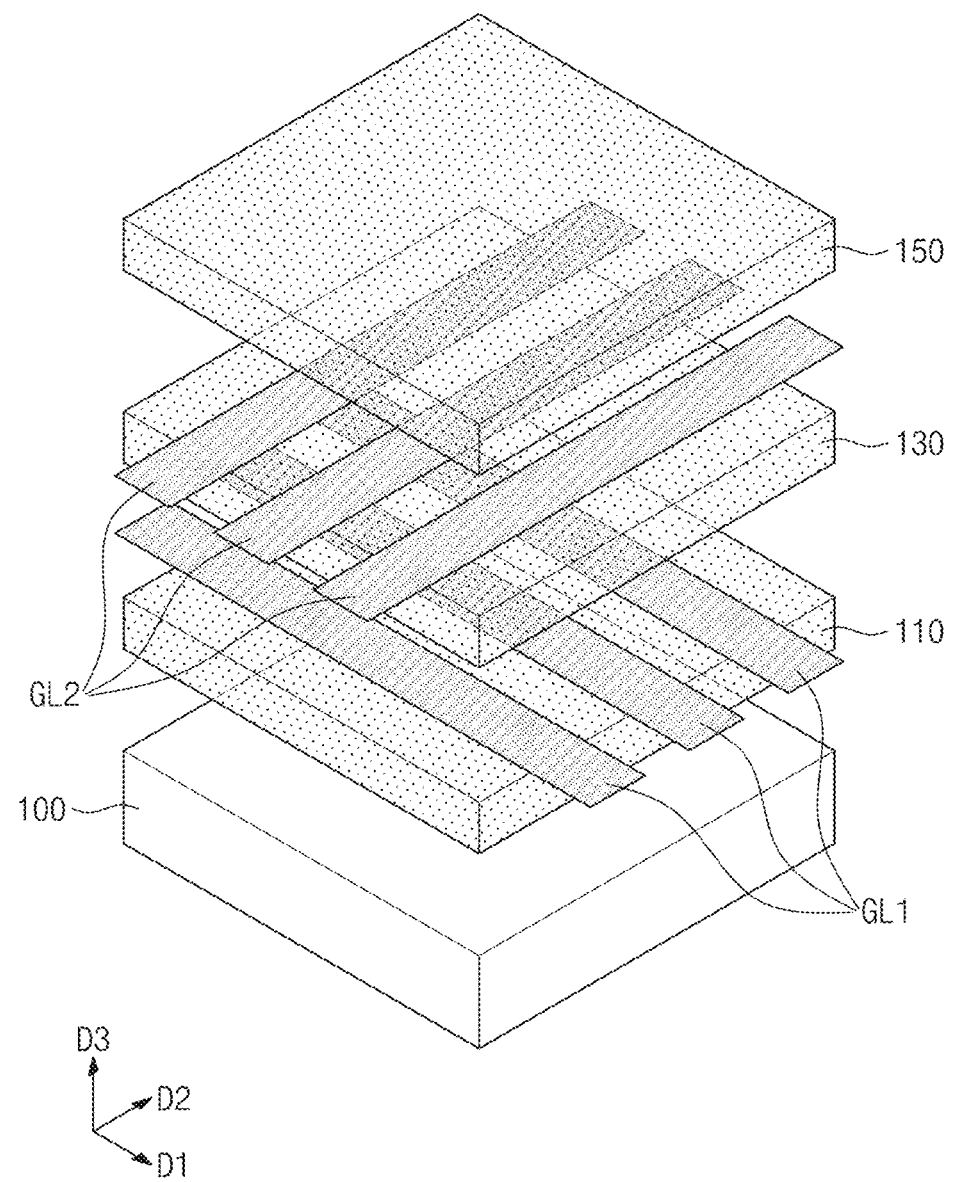
FIG. 10A is a perspective view illustrating an ultraviolet emitting optical device according to embodiments of the inventive concept.
Figure 10B:
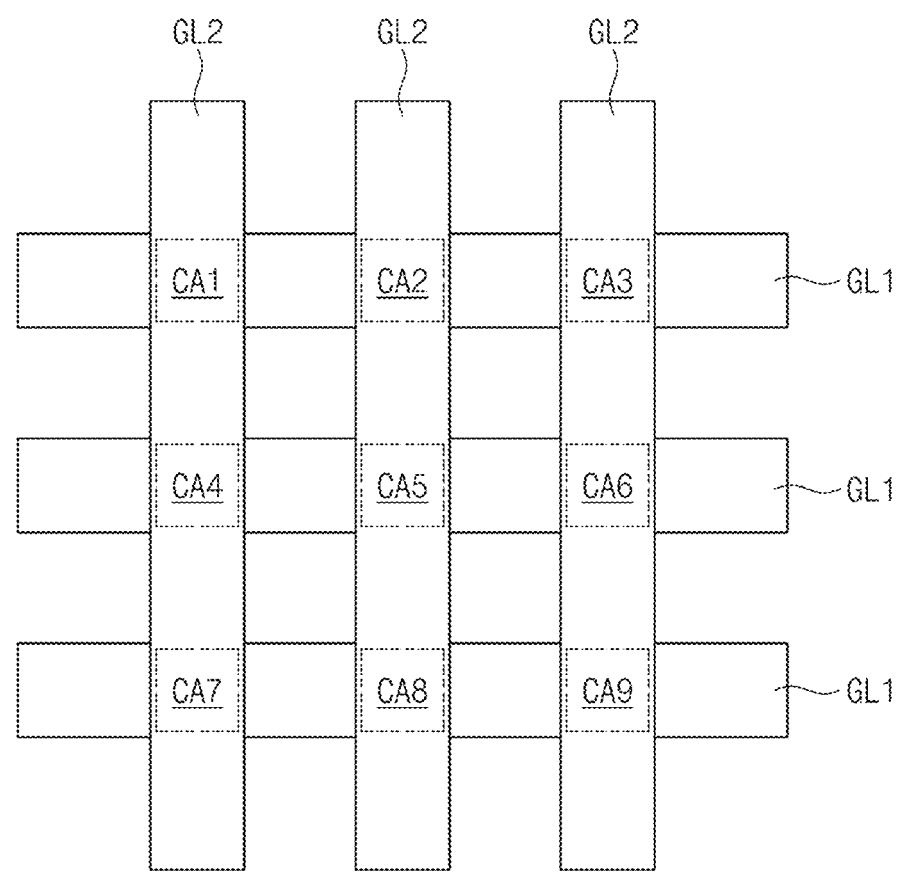
FIG. 10B is a plan view illustrating a crossing region of first and second electrode layers of the ultraviolet emitting optical device of FIG. 10A.

FIG. 10A is a perspective view illustrating an ultraviolet emitting optical device according to embodiments of the inventive concept. FIG. 10B is a plan view illustrating a crossing region of first and second electrode layers of the ultraviolet emitting optical device of FIG. 10A. Hereinafter, for convenience of explanation, descriptions of substantially the same matters as those described with reference to FIGS. 1A and 1B will be omitted, and differences will be described in detail.

Referring to FIGS. 10A and 10B, a plurality of first electrode layers GL1 extending in the first direction D1 between the first encapsulation layer 110 and the active layer 130 may be provided. The plurality of first electrode layers GL1 may extend in parallel in the first direction D1 and may be spaced apart from each other in the second direction D2 at regular intervals. A plurality of second electrode layers GL2 extending in the second direction D2 between the second encapsulation layer 150 and the active layer 130 may be provided. The plurality of second electrode layers GL2 may extend in parallel in the second direction D2 and may be spaced apart from each other in the first direction D1 at regular intervals. Although the number of the first electrode layers GL1 and the number of the second electrode layers GL2 are each shown to be three, this is merely exemplary and the inventive concept is not limited thereto.

Regions where the first electrode layers GL1 and the second electrode layers GL2 overlap in the third direction D3 may be referred to as first to ninth crossing regions CA1 to CA9. When a voltage is respectively applied to any one of the first electrode layers GL1 and the second electrode layers GL2, electro-luminescence may occur at any one of the first to ninth crossing regions CA1 to CA9.

The ultraviolet emitting optical device according to the inventive concept may be applied to a display element. In this case, each of the first to ninth crossing regions CA1 to CA9 may correspond to a pixel of the display element. In this case, the size of the pixel may be controlled by the width and/or spacing of each of the first and second electrode layers GL1 and GL2, and thus the size may be reduced more easily than other display elements. That is, the ultraviolet emitting optical device according to the inventive concept may be applied to a high-resolution display element including pixels having a high degree of integration.

In addition, when using a material capable of converting light in the ultraviolet wavelength range into light in the visible wavelength range, the ultraviolet emitting optical device according to the inventive concept may be applied to a display element including RGB sub-pixels. In addition, the ultraviolet emitting optical device according to the inventive concept may be applied to a transparent and flexible display element due to material properties such as hexagonal boron nitride (hBN) and graphene.

Since the ultraviolet emitting optical device according to embodiments of the inventive concept uses a commercially available material, it is easy to manufacture and operates regardless of temperature, so that the ultraviolet emitting optical device may not require preheating and may be operated at a voltage as low as several tens of V. In addition, since the ultraviolet emitting optical device according to embodiments of the inventive concept emits ultraviolet light in the UVC region (wavelength range of about 200 nm to about 280 nm), it may be used in an ultraviolet sterilizer.

In addition, according to an ultraviolet emitting optical device and an operating method thereof according to embodiments of the inventive concept, color centers serving as light sources may be generated at predetermined (or desired) locations, and the intensity and emission wavelength of the emitted light may be controlled by controlling the intensity and direction of the electric field. The ultraviolet emitting optical device according to embodiments of the inventive concept may be applied to a display element. More specifically, the ultraviolet emitting optical device according to embodiments of the inventive concept may be applied to a high-resolution display element including pixels having a high degree of integration.

In addition, when using a material capable of converting light in the ultraviolet wavelength range into light in the visible wavelength range, the ultraviolet emitting optical device according to the inventive concept may be applied to a display element including RGB sub-pixels. In addition, the ultraviolet emitting optical device according to the inventive concept may be applied to a transparent and flexible display element due to material properties such as hexagonal boron nitride (hBN) and graphene.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:

1. An ultraviolet emitting optical device comprising:
a substrate;
a first encapsulation layer, an active layer, and a second encapsulation layer sequentially stacked on the substrate, the active layer including color centers;
a first electrode layer between the first encapsulation layer and the active layer; and
a second electrode layer between the active layer and the second encapsulation layer;
wherein the active layer comprises hexagonal boron nitride (hBN),
wherein a partial region of the active layer overlapping the first electrode layer and the second electrode layer in a vertical direction defines a crossing region,
wherein the color centers of the active layer overlap an edge of the second electrode layer in the vertical direction inn the crossing region, and wherein the color centers of the active layer are configured to emit light in an ultraviolet wavelength range based on electric fields applied by the first and second electrode layers.

2. The ultraviolet emitting optical device of claim 1, wherein the color centers of the active layer are formed by deforming a crystal structure of the active layer or by implanting some of atoms constituting the first and second electrode layers into the crystal structure of the active layer.

3. The ultraviolet emitting optical device of claim 1, wherein a side surface of the second electrode layer in the crossing region has a geometric pattern different from a side surface of the second electrode layer outside the crossing region.

4. The ultraviolet emitting optical device of claim 2, wherein a band gap energy of each of the color centers is 3.3 eV to 6.5 eV.

5. The ultraviolet emitting optical device of claim 1, wherein the first electrode layer and the second electrode layer comprise at least one of graphene, silicon (Si), magnesium (Mg), carbon (C), gallium (Ga), metal elements, or transition metal dichalcogenides.

6. The ultraviolet emitting optical device of claim 1, wherein the first encapsulation layer and the second encapsulation layer comprise hexagonal boron nitride.

7. The ultraviolet emitting optical device of claim 1, wherein each of junctions of the first and second electrode layers and the active layer is a van der Waals heterostructure.

8. The ultraviolet emitting optical device of claim 1, wherein the first electrode layer extends in a first direction parallel to an upper surface of the substrate,
wherein the second electrode layer is parallel to the upper surface of the substrate and extends in a second direction intersecting the first direction.

9. The ultraviolet emitting optical device of claim 1, wherein a side surface of the second electrode layer in the crossing region has a wave pattern or a sawtooth pattern or a curved shape.

10. The ultraviolet emitting optical device of claim 1, wherein the first electrode layer comprises a first portion extending in a first direction parallel to an upper surface of the substrate and a second portion connected to an end of the first portion,
wherein the second electrode layer comprises a first portion extending in the first direction and a second portion overlapping the first electrode layer in the vertical direction,
wherein the first portion of the first electrode layer does not overlap the first portion of the second electrode layer in the vertical direction.

11. The ultraviolet emitting optical device of claim 1, wherein the active layer comprises a first active layer on the first electrode layer and a second active layer between the first active layer and the second electrode layer, and further comprises a third electrode layer between the first active layer and the second active layer.

12. The ultraviolet emitting optical device of claim 1, wherein the active layer comprises first to third active layers sequentially stacked on the first encapsulation layer between the first electrode layer and the second electrode layer,
wherein a crystal structure of each of the first to third active layers extends in different directions.

13. The ultraviolet emitting optical device of claim 1, wherein the first electrode layer is provided in plurality, and each of the plurality of first electrode layers extends in a first direction parallel to an upper surface of the substrate,
wherein the second electrode layer is provided in plurality, and each of the plurality of second electrode layers extends in a second direction parallel to the upper surface of the substrate and intersecting the first direction,
wherein the plurality of first electrode layers are spaced apart from each other in the second direction at regular intervals,
wherein the plurality of second electrode layers are spaced apart from each other in the first direction at regular intervals.

14. An operating method of an ultraviolet emitting optical device including a substrate, a first encapsulation layer, an active layer and a second encapsulation layer sequentially stacked on the substrate, a first electrode layer between the first encapsulation layer and the active layer, and a second electrode layer between the active layer and the second encapsulation layer, the method comprising:
applying a first electric field between the first electrode layer and the second electrode layer to form color centers within the active layer; and
applying a second electric field between the first electrode layer and the second electrode layer to excite the color centers of the active layer,
wherein the active layer comprises hexagonal boron nitride (hBN),
wherein a partial region of the active layer overlapping the first electrode layer and the second electrode layer in a vertical direction defines a crossing region,
wherein the color centers of the active layer overlap an edge of the second electrode layer in the vertical direction in the crossing region,
wherein at least a portion of a side surface of the second electrode layer defining the crossing region has a geometric pattern different from a side surface of the second electrode layer outside the crossing region, and
wherein the excited color centers of the active layer emit light in an ultraviolet wavelength range based on the second electric field.

15. The method of claim 14, further comprising controlling an intensity and direction of the second electric field,
wherein an intensity of the emitted light is controlled through controlling the intensity of the second electric field,
wherein an emission wavelength is controlled through controlling the direction of the second electric field.

16. The method of claim 15, wherein controlling the direction of the second electric field changes the direction of the second electric field applied between the first electrode layer and the second electrode layer,
wherein changing the direction of the second electric field changes a state in which the first electrode layer is grounded and a voltage is applied to the second electrode layer to a state in which a voltage is applied to the first electrode layer and the second electrode layer is grounded, or vice versa.

17. The method of claim 16, wherein a wavelength change according to changing the direction of the second electric field is 10 nm to 50 nm.

18. The method of claim 14, wherein the color centers are generated at predetermined positions according to a shape and positional relationship of the first electrode layer and the second electrode layer.

19. The method of claim 14, wherein the active layer comprises a first active layer on the first electrode layer and a second active layer between the first active layer and the second electrode layer, and wherein the ultraviolet emitting optical device further comprises a third electrode layer between the first active layer and the second active layer.

\* \* \* \* \*